(12) United States Patent
Kawamoto et al.

(10) Patent No.: US 10,173,923 B2
(45) Date of Patent: Jan. 8, 2019

(54) TEMPERED GLASS, TEMPERED GLASS PLATE, AND GLASS FOR TEMPERING

(71) Applicant: Nippon Electric Glass Co., Ltd., Shiga (JP)

(72) Inventors: Kosuke Kawamoto, Shiga (JP); Takashi Murata, Shiga (JP); Takako Tojyo, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 129 days.

(21) Appl. No.: 15/234,491

(22) Filed: Aug. 11, 2016

(65) Prior Publication Data
US 2016/0347656 A1 Dec. 1, 2016

Related U.S. Application Data

(62) Division of application No. 14/378,150, filed as application No. PCT/JP2013/065718 on Jun. 6, 2013, now abandoned.

(30) Foreign Application Priority Data

| Jun. 8, 2012 | (JP) | 2012-130506 |
|---|---|---|
| Aug. 3, 2012 | (JP) | 2012-172540 |
| Sep. 14, 2012 | (JP) | 2012-202408 |

(51) Int. Cl.

| C03C 21/00 | (2006.01) |
|---|---|
| C03C 3/085 | (2006.01) |
| C03C 3/087 | (2006.01) |
| C03C 3/091 | (2006.01) |
| C03C 3/093 | (2006.01) |
| C03C 4/18 | (2006.01) |
| H01L 31/048 | (2014.01) |
| H05K 5/02 | (2006.01) |
| C03B 17/06 | (2006.01) |
| C03B 25/12 | (2006.01) |

(52) U.S. Cl.
CPC .......... *C03C 21/002* (2013.01); *C03B 17/064* (2013.01); *C03B 25/12* (2013.01); *C03C 3/085* (2013.01); *C03C 3/087* (2013.01); *C03C 3/091* (2013.01); *C03C 3/093* (2013.01); *C03C 4/18* (2013.01); *H01L 31/048* (2013.01); *H01L 31/0488* (2013.01); *H05K 5/02* (2013.01); *C03C 2204/00* (2013.01); *Y02E 10/50* (2013.01); *Y10T 428/315* (2015.01)

(58) Field of Classification Search
CPC ....... C03C 21/002; C03C 3/091; C03C 3/093; C03C 3/087; C03C 3/085; C03C 4/18; C03C 2204/00; C03B 17/064; C03B 25/12
USPC ........................................................ 428/410
See application file for complete search history.

(56) References Cited

U.S. PATENT DOCUMENTS

| 5,900,296 A | 5/1999 | Hayashi et al. |
|---|---|---|
| 6,251,812 B1 | 6/2001 | Koyama et al. |
| 2003/0220183 A1 | 11/2003 | Kurachi et al. |
| 2005/0003136 A1 | 1/2005 | Kurachi et al. |
| 2006/0063009 A1 | 3/2006 | Naitou et al. |
| 2009/0197088 A1* | 8/2009 | Murata ................... C03C 3/083 428/410 |
| 2009/0220761 A1* | 9/2009 | Dejneka ................. C03B 17/067 428/220 |
| 2010/0047521 A1 | 2/2010 | Amin et al. |
| 2010/0087307 A1 | 4/2010 | Murata et al. |
| 2010/0119846 A1 | 5/2010 | Sawada |
| 2010/0291353 A1 | 11/2010 | Dejneka et al. |
| 2011/0071012 A1 | 3/2011 | Kondo et al. |
| 2011/0274916 A1 | 11/2011 | Murata |
| 2013/0115422 A1 | 5/2013 | Murata |

FOREIGN PATENT DOCUMENTS

| JP | 2004-131314 | 4/2004 |
|---|---|---|
| JP | 2006-83045 | 3/2006 |
| JP | 2010-59038 | 3/2010 |
| JP | 2010-168252 | 8/2010 |
| JP | 2010-180076 | 8/2010 |
| JP | 2011-84456 | 4/2011 |
| JP | 2012-500177 | 1/2012 |
| WO | 2011/022661 | 2/2011 |

OTHER PUBLICATIONS

International Search Report dated Aug. 20, 2013 in International (PCT) Application No. PCT/JP2013/065718.
Tetsuro Izumitani et al., "New Glass and Physical Properties Thereof," First Edition, Management System Laboratory. Co., Ltd., Aug. 20, 1984, p. 451-498 with partial English translation.
International Preliminary Report on Patentability and Written Opinion of the International Searching Authority dated Dec. 9, 2014 in International (PCT) Application No. PCT/JP2013/065718.

* cited by examiner

*Primary Examiner* — Hui H Chin
(74) *Attorney, Agent, or Firm* — Wenderoth, Lind & Ponack, L.L.P.

(57) ABSTRACT

A tempered glass has a compressive stress layer in a surface thereof, includes as a glass composition, in terms of mass %, 50 to 80% of $SiO_2$, 10 to 30% of $Al_2O_3$, 0 to 6% of $B_2O_3$, 0 to 2% of $Li_2O$, and 5 to 25% of $Na_2O$, and is substantially free of $As_2O_3$, $Sb_2O_3$, PbO, and F.

6 Claims, No Drawings

TEMPERED GLASS, TEMPERED GLASS PLATE, AND GLASS FOR TEMPERING

TECHNICAL FIELD

The present invention relates to a tempered glass and a tempered glass sheet, and a glass to be tempered, and more particularly, to a tempered glass and a tempered glass sheet, and a glass to be tempered suitable for a cover glass for a cellular phone, a digital camera, a personal digital assistant (PDA), or a solar battery, or a glass substrate for a display, in particular, a touch panel display.

BACKGROUND ART

Devices such as a cellular phone, a digital camera, a PDA, a touch panel display, a large-screen television, and contactless power transfer show a tendency of further prevalence.

A tempered glass, which is produced by applying tempering treatment to glass through ion exchange treatment or the like, is used for those applications (see Patent Literature 1 and Non Patent Literature 1).

In addition, in recent years, the tempered glass has been more and more frequently used in exterior parts of, for example, digital signage, mice, and smartphones.

Characteristics required of the tempered glass include (1) high mechanical strength, (2) low cost, and (3) high dimensional accuracy. In digital signage applications, a structure in which a plurality of panels are linked together has been adopted in an increasing number of cases, and in association with this, a higher level of dimensional accuracy has been demanded. Specifically, while a conventional dimensional tolerance has been about ±4,000 ppm, a demand has arisen for a dimensional tolerance of about ±1,000 ppm.

CITATION LIST

Patent Literature

[PTL 1] JP 2006-83045 A

Non Patent Literature

[NPL 1] Tetsuro Izumitani et al., "New glass and physical properties thereof," First edition, Management System Laboratory. Co., Ltd., Aug. 20, 1984, p. 451-498

SUMMARY OF INVENTION

Technical Problem

However, a tempered glass (glass to be tempered) is liable to undergo a dimensional change between before and after tempering treatment. Thus, it is not easy to increase the dimensional accuracy of the tempered glass.

In addition, the tempering treatment is generally performed by immersing the glass to be tempered in a high-temperature (for example, from 300 to 500° C.) $KNO_3$ molten salt. Accordingly, the tempering treatment of a large-size glass sheet to be tempered involves a problem in that the glass is liable to undergo breakage owing to a thermal shock when the glass to be tempered is immersed or when the tempered glass sheet is taken out. In order to solve the problem, it is conceivable to employ a method involving preheating the glass sheet to be tempered before immersion, or annealing the tempered glass sheet that has been taken out. However, such method requires a long period of time, and hence involves a risk that the manufacturing cost of the tempered glass sheet may soar.

The present invention has been made in view of the above-mentioned circumstances, and a technical object of the present invention is to devise a tempered glass, tempered glass sheet, and glass to be tempered that have high ion exchange performance, hardly undergo a dimensional change before and after tempering treatment, and have high thermal shock resistance.

Solution to Problem

The inventors of the present invention have made various studies and have consequently found that the technical object can be achieved by strictly controlling the glass composition. Thus, the finding is proposed as the present invention. That is, a tempered glass of the present invention has a compressive stress layer in a surface thereof, comprises as a glass composition, in terms of mass %, 50 to 80% of $SiO_2$, 10 to 30% of $Al_2O_3$, 0 to 6% of $B_2O_3$, 0 to 2% of $Li_2O$, and 5 to 25% of $Na_2O$, and is substantially free of $As_2O_3$, $Sb_2O_3$, PbO, and F. Herein, the gist of the phrase "substantially free of $As_2O_3$" resides in that $As_2O_3$ is not added positively as a glass component, but contamination with $As_2O_3$ as an impurity is allowable. Specifically, the phrase means that the content of $As_2O_3$ is less than 0.1 mass %. The gist of the phrase "substantially free of $Sb_2O_3$" resides in that $Sb_2O_3$ is not added positively as a glass component, but contamination with $Sb_2O_3$ as an impurity is allowable. Specifically, the phrase means that the content of $Sb_2O_3$ is less than 0.1 mass %. The gist of the phrase "substantially free of PbO" resides in that PbO is not added positively as a glass component, but contamination with PbO as an impurity is allowable. Specifically, the phrase means that the content of PbO is less than 0.1 mass %. The gist of the phrase "substantially free of F" resides in that F is not added positively as a glass component, but contamination with F as an impurity is allowable. Specifically, the phrase means that the content of F is less than 0.1 mass %.

The introduction of given amounts of $Al_2O_3$ and the alkali metal oxides into the glass composition can enhance ion exchange performance, thermal shock resistance, and devitrification resistance. Further, the devitrification resistance can be enhanced by regulating the contents and content ratios of $Al_2O_3$, $B_2O_3$, and alkaline earth metal oxides.

Second, the tempered glass of the present invention preferably comprises as a glass composition, in terms of mass %, 50 to 80% of $SiO_2$, 10 to 30% of $Al_2O_3$, 0 to 6% of $B_2O_3$, 0 to 1.7% of $Li_2O$, more than 7.0 to 25% of $Na_2O$, and 0 to 2% of SrO.

Third, the tempered glass of the present invention preferably comprises as a glass composition, in terms of mass %, 50 to 76% of $SiO_2$, more than 16.0 to 30% of $Al_2O_3$, 0 to 6% of $B_2O_3$, 0 to 1.7% of $Li_2O$, more than 7.0 to 25% of $Na_2O$, 0 to 2% of SrO, and 0 to 4.5% of $TiO_2$.

Fourth, the tempered glass of the present invention preferably comprises as a glass composition, in terms of mass %, 50 to 76% of $SiO_2$, more than 16.0 to 30% of $Al_2O_3$, 0 to 6% of $B_2O_3$, 0 to 1.7% of $Li_2O$, more than 7.0 to 25% of $Na_2O$, 0 to 2% of SrO, 0 to 0.5% of $TiO_2$, and 0 to 4% of $ZrO_2$.

Fifth, the tempered glass of the present invention preferably comprises as a glass composition, in terms of mass %, 50 to 76% of $SiO_2$, more than 16.0 to 30% of $Al_2O_3$, 0 to 6% of $B_2O_3$, 0 to 1.7% of $Li_2O$, more than 7.0 to 25% of $Na_2O$, 0 to 2% of SrO, 0 to 0.5% of $TiO_2$, 0 to 4% of $ZrO_2$, and 0 to 1% of $P_2O_5$, and preferably has a molar ratio (MgO+CaO+SrO+BaO)/($Al_2O_3$+$B_2O_3$) of from 0 to 0.60. Herein, the term "MgO+CaO+SrO+BaO" refers to the total amount of MgO, CaO, SrO, and BaO. In addition, the term "Al$_2$O$_3$+B$_2$O$_3$" refers to the total amount of Al$_2$O$_3$ and B$_2$O$_3$.

Sixth, the tempered glass of the present invention preferably comprises as a glass composition, in terms of mass %, 50 to 76% of SiO$_2$, more than 16.0 to 30% of Al$_2$O$_3$, 0 to 6% of B$_2$O$_3$, 0 to less than 1.0% of Li$_2$O, more than 7.0 to 25% of Na$_2$O, 0 to 2% of SrO, 0 to 0.5% of TiO$_2$, 0 to 2% of ZrO$_2$, 0.2 to 3% of SnO$_2$, and to 1% of P$_2$O$_5$, and preferably has a molar ratio (MgO+CaO+SrO+BaO)/(Al$_2$O$_3$+B$_2$O$_3$) of from 0 to 0.55.

Seventh, the tempered glass of the present invention preferably comprises as a glass composition, in terms of mass %, 50 to 73% of SiO$_2$, more than 16.0 to 30% of Al$_2$O$_3$, 0 to 6% of B$_2$O$_3$, 0 to less than 1.0% of Li$_2$O, more than 7.0 to 25% of Na$_2$O, 10 to 30% of Li$_2$O+Na$_2$O+K$_2$O, 0 to 4% of CaO, 0 to 2% of SrO, 0 to 0.5% of TiO$_2$, 0 to 2% of ZrO$_2$, 0.2 to 3% of SnO$_2$, and 0 to 1% of P$_2$O$_5$, and preferably has a molar ratio (MgO+CaO+SrO+BaO)/(Al$_2$O$_3$+B$_2$O$_3$) of from 0 to 0.55. Herein, the term "Li$_2$O+Na$_2$O+K$_2$O" means the total amount of Li$_2$O, Na$_2$O, and K$_2$O.

Eighth, in the tempered glass of the present invention, it is preferred that a compression stress value of the compression stress layer be 300 MPa or more and 1,200 MPa or less, and a thickness of the compression stress layer be 10 μm or more and 60 μm or less. Herein, the "compression stress value of the compression stress layer" and the "thickness of the compression stress layer" refer to values calculated from the number of interference fringes and intervals therebetween, the interference fringes being observed when a sample is observed using a surface stress meter (for example, FSM-6000 manufactured by TOSHIBA CORPORATION).

Ninth, the tempered glass of the present invention preferably has a liquidus temperature of 1,200° C. or less. Herein, the term "liquidus temperature" refers to a temperature at which crystals of glass are deposited after glass powder that passes through a standard 30-mesh sieve (sieve opening: 500 μm) and remains on a 50-mesh sieve (sieve opening: 300 μm) is placed in a platinum boat and then kept for 24 hours in a gradient heating furnace.

Tenth, the tempered glass of the present invention preferably has a liquidus viscosity of $10^{4.0}$ dPa·s or more. Herein, the term "liquidus viscosity" refers to a value obtained through measurement of a viscosity of glass at the liquidus temperature by a platinum sphere pull up method.

Eleventh, the tempered glass of the present invention preferably has a temperature at $10^{4.0}$ dPa·s of 1,300° C. or less. Herein, the phrase "temperature at $10^{4.0}$ dPa·s" refers to a value obtained through measurement by a platinum sphere pull up method.

Twelfth, the tempered glass of the present invention preferably has a thermal expansion coefficient in a temperature range of from 25 to 380° C. of $100 \times 10^{-7}$/° C. or less. Herein, the phrase "thermal expansion coefficient in a temperature range of from 25 to 380° C." refers to a value obtained by measuring an average thermal expansion coefficient with a dilatometer.

Thirteenth, a tempered glass sheet of the present invention comprises the tempered glass.

Fourteenth, a tempered glass sheet of the present invention is a tempered glass sheet having a length dimension of 500 mm or more, a width dimension of 300 mm or more, and a thickness of from 0.5 to 2.0 mm, having a compression stress value of a compression stress layer of 300 MPa or more and 1,200 MPa or less and a thickness of the compression stress layer of 10 μm or more and 60 μm or less, and being subjected to tempering treatment so as to have a dimensional change rate S between before and after tempering treatment of from −1,000 ppm to +1,000 ppm. Herein, the "dimensional change rate S between before and after tempering treatment" refers to a value obtained by measuring a length dimension Lb before tempering treatment and a length dimension La after tempering treatment, and then performing calculation by substituting the length dimensions into the following equation:

$$S = 1,000,000 \times (La - Lb)/Lb.$$

Fifteenth, the tempered glass sheet of the present invention preferably has a Young's modulus of 65 GPa or more.

Sixteenth, the tempered glass sheet of the present invention preferably has a fictive temperature Tf of 500° C. or more. Herein, the "fictive temperature Tf" is an indicator for the molecular structure of glass reflecting thermal history during the cooling and solidification of a glass melt. Its value increases as the cooling is performed more rapidly, and lowers as the cooling is performed more slowly. A measurement method for the fictive temperature Tf is described below. A sample is kept at a temperature equal to or higher than its strain point for a sufficient period of time (for example, 24 hours), then rapidly cooled by, for example, being immediately brought into contact with a metal sheet, and measured for its dimensional change. When the sample is kept at a temperature T1 higher than the fictive temperature Tf, the dimensional change shows a positive value ΔL1, and when the sample is kept at a temperature T2 lower than the fictive temperature Tf, the dimensional change shows a negative value ΔL2. In the case where T1−T2 is from 0 to 20° C., the Tf can be determined from the following equation.

$$Tf = (T2 \times \Delta L1 - T1 \times \Delta L2)/(\Delta L1 - \Delta L2)$$

Seventeenth, the tempered glass sheet of the present invention is preferably formed by an overflow down-draw method. Herein, the "overflow down-draw method" refers to a method comprising causing a molten glass to overflow from both sides of a heat-resistant forming trough, and subjecting the overflowing molten glasses to down-draw downward while the molten glasses are joined at the lower end of the forming trough, to thereby manufacture a glass sheet. In the overflow down-draw method, surfaces that are to serve as the surfaces of the glass sheet are formed in a state of free surfaces without being brought into contact with the surface of the forming trough. Accordingly, a glass sheet having satisfactory surface quality in an unpolished state can be manufactured at low cost.

Eighteenth, the tempered glass sheet of the present invention is preferably cut at a position spaced apart downwardly by 1,000 mm or more from a lower end of a forming trough used in the overflow down-draw method.

Nineteenth, the tempered glass sheet of the present invention is preferably used for a touch panel display.

Twentieth, the tempered glass sheet of the present invention is preferably used for a cover glass for a cellular phone.

Twenty-first, the tempered glass sheet of the present invention is preferably used for a cover glass for a solar battery.

Twenty-second, the tempered glass sheet of the present invention is preferably used for a protective member for a display.

Twenty-third, a tempered glass sheet of the present invention is a tempered glass sheet having a length dimension of 500 mm or more, a width dimension of 300 mm or more, and a thickness of from 0.3 to 2.0 mm, comprising as a glass composition, in terms of mass %, 50 to 80% of $SiO_2$, 10 to 30% of $Al_2O_3$, 0 to 6% of $B_2O_3$, 0 to 2% of $Li_2O$, 5 to 25% of $Na_2O$, 10 to 30% of $Li_2O+Na_2O+K_2O$, 0 to 2% of SrO, 0 to less than 0.50% of $TiO_2$, 0 to 4% of $ZrO_2$, 0.2 to 3% of $SnO_2$, and 0 to 1% of $P_2O_5$, having a molar ratio (MgO+ CaO+SrO+BaO)/($Al_2O_3+B_2O_3$) of from 0 to 0.60, being substantially free of $As_2O_3$, $Sb_2O_3$, PbO, and F, having a compression stress value of a compression stress layer of 300 MPa or more and 1,200 MPa or less, a thickness of the compression stress layer of 10 μm or more and 60 μm or less, a liquidus temperature of 1,200° C. or less, a thermal expansion coefficient in a temperature range of from 25 to 380° C. of $100 \times 10^{-7}$ or less, a Young's modulus of 65 GPa or more, and a fictive temperature Tf of 500° C. or more, and being subjected to tempering treatment so as to have a dimensional change rate S between before and after tempering treatment of from −1,000 ppm to +1,000 ppm.

Twenty-fourth, a glass to be tempered of the present invention comprises as a glass composition, in terms of mass %, 50 to 80% of $SiO_2$, 10 to 30% of $Al_2O_3$, 0 to 6% of $B_2O_3$, 0 to 2% of $Li_2O$, and 5 to 25% of $Na_2O$, and being substantially free of $As_2O_3$, $Sb_2O_3$, PbO, and F.

Twenty-fifth, a glass to be tempered of the present invention has a dimensional change rate S between before and after tempering treatment (immersion in a $KNO_3$ molten salt at 440° C. for 6 hours) of from −1,000 ppm to +1,000 ppm. It should be noted that as the $KNO_3$ molten salt, there is used one having no history of being used.

Twenty-sixth, the glass to be tempered of the present invention preferably has a fictive temperature Tf of 500° C. or more.

Advantageous Effects of Invention

The tempered glass of the present invention has high ion exchange performance. Accordingly, even when ion exchange treatment is performed for a short period of time, the compression stress value of its compression stress layer increases and the compression stress layer is formed so as to reach a deep portion. As a result, its mechanical strength is enhanced, and a variation in mechanical strength reduces.

In addition, the tempered glass of the present invention is excellent in devitrification resistance, and hence can be efficiently formed into a shape by the overflow down-draw method. It should be noted that according to the overflow down-draw method, a glass sheet having a large size and a small thickness can be formed in a large amount.

Further, the tempered glass of the present invention has a low thermal expansion coefficient, and hence the time required for preheating before tempering treatment and/or the time required for annealing after tempering treatment can be shortened. In addition, the tempered glass of the present invention has a high Young's modulus and a high fictive temperature Tf, and hence the dimensional change between before and after tempering treatment can be reduced.

DESCRIPTION OF EMBODIMENTS

A tempered glass of the present invention has a compression stress layer in a surface thereof. A method of forming the compression stress layer in the surface includes a physical tempering method and a chemical tempering method. The tempered glass of the present invention is preferably produced by the chemical tempering method.

The chemical tempering method is a method involving introducing alkali ions each having a large ion radius into the surface of glass by ion exchange treatment at a temperature equal to or lower than a strain point of the glass. When the chemical tempering method is used to form a compression stress layer, the compression stress layer can be properly formed even in the case where the thickness of the glass is small. In addition, even when a tempered glass is cut after the formation of the compression stress layer, the tempered glass does not easily break unlike a tempered glass produced by applying a physical tempering method such as an air cooling tempering method.

The following description shows the reason why the content range of each component in the tempered glass of the present invention is controlled in the above-mentioned range. It should be noted that in the description of the content range of each component, the expression "%" means "mass %" unless otherwise specified.

$SiO_2$ is a component that forms a network of glass, and the content of $SiO_2$ is from 50 to 80%, preferably from 55 to 76%, more preferably from 55 to 75%, more preferably from 55 to 73%, more preferably from 55 to 72%, more preferably from 56 to 69%, particularly preferably from 57 to 67%. When the content of $SiO_2$ is too small in glass, vitrification does not occur easily, the thermal expansion coefficient becomes too high, and the thermal shock resistance easily lowers. On the other hand, when the content of $SiO_2$ is too large in glass, the meltability and formability easily lower, and the thermal expansion coefficient becomes too low, with the result that it becomes difficult to match the thermal expansion coefficient with those of peripheral materials.

$Al_2O_3$ is a component that enhances the ion exchange performance of glass and a component that enhances the strain point or Young's modulus, and the content of $Al_2O_3$ is from 10 to 30%. When the content of $Al_2O_3$ is too small in glass, the ion exchange performance may not be exhibited sufficiently. Thus, the lower limit range of $Al_2O_3$ is preferably 12% or more, more preferably 13% or more, more preferably 14% or more, more preferably 15% or more, more preferably 15.5% or more, more preferably more than 16.0%, more preferably 16.1% or more, more preferably 16.3% or more, more preferably 16.5% or more, more preferably 17.1% or more, more preferably 17.5% or more, more preferably 18% or more, particularly preferably 18.5% or more. On the other hand, when the content of $Al_2O_3$ is too large in glass, devitrified crystals are easily deposited in the glass, and it becomes difficult to forma glass sheet by an overflow down-draw method or the like. In particular, when a glass sheet is formed by an overflow down-draw method through use of a forming trough of alumina, a devitrified crystal of spinel is easily deposited at an interface between the glass sheet and the forming trough of alumina. Further, the thermal expansion coefficient of the glass becomes too low, and it becomes difficult to match the thermal expansion coefficient with those of peripheral materials. In addition, acid resistance also lowers, which makes it difficult to apply the tempered glass to an acid treatment step. Further, viscosity at high temperature increases, and the meltability easily lowers. Thus, the upper limit range of the content of $Al_2O_3$ is preferably 28% or less, more preferably 26% or less, more preferably 24% or less, more preferably 23.5% or less, more preferably 22% or less, more preferably 21% or less, more preferably 20% or less, particularly preferably 19% or less. It should be noted that in the case where high importance is placed on mechanical strength, for example, in the case where tempering treatment is performed after cutting into a cover glass shape and polishing, it is preferred to increase the content of $Al_2O_3$ to the extent possible by sacrificing acid resistance to some degree. In that case, the lower limit range of the content of $Al_2O_3$ is preferably 16% or more, more preferably 17% or more, more preferably 18% or more, more preferably 18.5% or more, more preferably 19% or more, more preferably 20% or more, more preferably 21% or more, more preferably 22% or more, particularly preferably 23% or more. The upper limit range of the content of $Al_2O_3$ is preferably 30% or less, more preferably 29% or less, more preferably 27% or less, more preferably 26% or less, more preferably 25.5% or less, particularly preferably 25% or less.

$B_2O_3$ is a component that lowers the viscosity at high temperature and density of glass, stabilizes the glass for a crystal to be unlikely precipitated, and lowers the liquidus temperature of the glass. The lower limit range of the content of $B_2O_3$ is preferably 0% or more, more preferably 0.01% or more, more preferably 0.05% or more, more preferably 0.1% or more, particularly preferably 0.4% or more. However, when the content of $B_2O_3$ is too large, through ion exchange, coloring on the surface of glass called weathering may occur, water resistance may lower, and the thickness of a compression stress layer is liable to decrease. Thus, the upper limit range of the content of $B_2O_3$ is preferably 6% or less, more preferably 5% or less, more preferably 4% or less, more preferably 3.95% or less, more preferably 3% or less, more preferably 2% or less, particularly preferably less than 2.0%.

$Li_2O$ is an ion exchange component and is a component that lowers the viscosity at high temperature of glass to increase the meltability and the formability, and increases the Young's modulus. Further, $Li_2O$ has a great effect of increasing the compression stress value of glass among alkali metal oxides, but when the content of $Li_2O$ becomes extremely large in a glass system containing $Na_2O$ at 7% or more, the compression stress value tends to lower contrarily. Further, when the content of $Li_2O$ is too large in glass, the liquidus viscosity lowers, easily resulting in the devitrification of the glass, and the thermal expansion coefficient becomes too high, with the result that the thermal shock resistance lowers and it becomes difficult to match the thermal expansion coefficient with those of peripheral materials. In addition, the viscosity at low temperature of the glass becomes too low, and the stress relaxation occurs easily, with the result that the compression stress value lowers contrarily in some cases. Thus, the upper limit range of the content of $Li_2O$ is from 0 to 2%, and is preferably from 0 to 1.7%, more preferably from 0 to 1.5%, more preferably from 0 to 1%, more preferably from 0 to less than 1.0%, more preferably from 0 to 0.5%, more preferably from 0 to 0.3%, more preferably from 0 to 0.1%, particularly preferably from 0 to 0.05%.

$Na_2O$ is an ion exchange component and is a component that lowers the viscosity at high temperature of glass to increase the meltability and formability. $Na_2O$ is also a component that improves the devitrification resistance of glass. When the content of $Na_2O$ is too small in glass, the meltability lowers, the thermal expansion coefficient lowers, and the ion exchange performance is liable to lower. Thus, the content of $Na_2O$ is 5% or more, and the lower limit range of the content of $Na_2O$ is 7% or more, preferably more than 7.0%, more preferably 8% or more, more preferably 9% or more, more preferably 10% or more, more preferably 11% or more, more preferably 12% or more, more preferably 13% or more, more preferably 13.8% or more, particularly preferably 14% or more. On the other hand, when the content of $Na_2O$ is too large in glass, the thermal expansion coefficient becomes too high, with the result that the thermal shock resistance lowers, and it becomes difficult to match the thermal expansion coefficient with those of peripheral materials. Further, the strain point lowers excessively, and the glass composition loses its component balance, with the result that the devitrification resistance lowers contrarily in some cases. Thus, the content of $Na_2O$ is 25% or less, and the upper limit range of the content of $Na_2O$ is preferably 23% or less, more preferably 21% or less, more preferably 19% or less, more preferably 17% or less, more preferably 16.3% or less, more preferably 16% or less, particularly preferably 15% or less.

For example, the following components other than the components may be added.

$K_2O$ is a component that promotes ion exchange and is a component that allows the thickness of a compression stress layer to be easily enlarged among alkali metal oxides. $K_2O$ is also a component that lowers the viscosity at high temperature of glass to increase the meltability and formability. $K_2O$ is also a component that improves devitrification resistance. However, when the content of $K_2O$ is too large, the thermal expansion coefficient of glass becomes too large, the thermal shock resistance of the glass lowers, and it becomes difficult to match the thermal expansion coefficient with those of peripheral materials. Further, the strain point lowers excessively, and the glass composition loses its component balance, with the result that the devitrification resistance tends to lower contrarily. Thus, the upper limit range of the content of $K_2O$ is preferably 10% or less, more preferably 9% or less, more preferably 8% or less, more preferably 7% or less, particularly preferably 6% or less. It should be noted that when $K_2O$ is added, the addition amount is preferably 0.1% or more, more preferably 0.5% or more, more preferably 1% or more, more preferably 1.5% or more, particularly preferably 2% or more. In addition, when the addition of $K_2O$ is avoided as much as possible, the content of $K_2O$ is preferably from 0 to 1%, more preferably from 0 to less than 1.0%, particularly preferably from 0 to 0.05%.

When the content of $Li_2O+Na_2O+K_2O$ is too small in glass, the ion exchange performance or the meltability is liable to decrease. Thus, the lower limit range of the content of $Li_2O+Na_2O+K_2O$ is preferably 10% or more, more preferably 11% or more, more preferably 12% or more, more preferably 13% or more, more preferably 14% or more, more preferably 14.5% or more, more preferably 15% or more, more preferably 15.5% or more, particularly preferably 16% or more. On the other hand, when the content of $Li_2O+Na_2O+K_2O$ is too large in glass, the thermal expansion coefficient becomes too high, with the result that the thermal shock resistance lowers and it becomes difficult to match the thermal expansion coefficient with those of peripheral materials. In addition, the strain point lowers excessively, and the glass composition loses its component balance, with the result that the devitrification resistance tends to lower contrarily. Thus, the upper limit range of the content of $Li_2O+Na_2O+K_2O$ is preferably 30% or less, more preferably 27% or less, particularly preferably 25% or less.

MgO is a component that reduces the viscosity at high temperature of glass to enhance the meltability and formability, and increases the strain point and Young's modulus, and is a component that has a great effect of enhancing the ion exchange performance among alkaline earth metal oxides. Thus, the content of MgO is preferably from 0 to 10%. In this case, the lower limit range of the content of MgO is preferably 0% or more, more preferably 0.5% or more, more preferably 1% or more, more preferably 1.2% or more, more preferably 1.3% or more, particularly preferably 1.4% or more. However, when the content of MgO is too large in glass, the density and thermal expansion coefficient easily increase, and the devitrification of the glass tends to occur easily. Particularly when a glass sheet is formed by an overflow down-draw method using a forming trough of alumina, a devitrified crystal of spinel is easily deposited at an interface with the forming trough of alumina. Thus, the upper limit range of the content of MgO is preferably 9% or less, more preferably 8% or less, more preferably 7% or less, more preferably 6% or less, more preferably 5% or less, more preferably 4% or less, more preferably 3.5% or less, more preferably 3% or less, more preferably 2.5% or less, more preferably 2.4% or less, more preferably 2.3% or less, particularly preferably 2.2% or less.

The mass ratio $B_2O_3$/MgO is preferably from 0.01 to 5, more preferably from 0.01 to 3.5, more preferably from 0.01 to 2.2, particularly preferably from 0.01 to 1.5. With this, the viscosity at high temperature and the devitrification resistance can be easily made proper.

The lower limit value of the molar ratio $(3MgO+Al_2O_3)/Na_2O$ is preferably 0.0 or more, more preferably 0.5 or more, more preferably 0.6 or more, more preferably 0.7 or more, more preferably 0.8 or more, more preferably 0.9 or more, particularly preferably 1.0 or more. The upper limit value of the molar ratio $(3MgO+Al_2O_3)/Na_2O$ is preferably 2.5 or less, more preferably 2.0 or less, more preferably 1.9 or less, more preferably 1.8 or less, more preferably 1.7 or less, more preferably 1.6 or less, more preferably 1.5 or less, particularly preferably 1.4 or less. With this, when a glass sheet is formed by an overflow down-draw method using a forming trough of alumina, a devitrified crystal of spinel is hardly deposited at an interface with the forming trough of alumina.

CaO has greater effects of reducing the viscosity at high temperature of glass to enhance the meltability and formability and increasing the strain point and Young's modulus without involving a reduction in devitrification resistance as compared to other components. However, when the content of CaO is too large in glass, the density and thermal expansion coefficient increase, and the glass composition loses its component balance, with the result that the glass is liable to devitrify contrarily, the ion exchange performance lowers, and the deterioration of an ion exchange solution tends to occur easily. Thus, the content of CaO is preferably from 0 to 6%, more preferably from 0 to 5%, more preferably from 0 to 4%, more preferably from 0 to 3.5%, more preferably from 0 to 3%, more preferably from 0 to 2%, more preferably from 0 to 1%, more preferably from 0 to 0.5%, particularly preferably from 0 to 0.1%.

SrO is a component that reduces the viscosity at high temperature of glass to enhance the meltability and formability, and increases the strain point and Young's modulus. However, when the content thereof is too large in glass, an ion exchange reaction is liable to be inhibited, and moreover, the density and thermal expansion coefficient increase, and the devitrification of the glass occurs easily. Thus, the content of SrO is preferably from 0 to 2%, more preferably from 0 to 1.5%, more preferably from 0 to 1%, more preferably from 0 to 0.5%, more preferably from 0 to 0.1%, particularly preferably from 0 to less than 0.1%.

BaO is a component that reduces the viscosity at high temperature of glass to enhance the meltability and formability, and increases the strain point and Young's modulus. However, when the content of BaO is too large in glass, an ion exchange reaction is liable to be inhibited, and moreover, the density and thermal expansion coefficient increase, and the devitrification of the glass occurs easily. Thus, the content of BaO is preferably from 0 to 6%, more preferably from 0 to 3%, more preferably from 0 to 1.5%, more preferably from 0 to 1%, more preferably from 0 to 0.5%, more preferably from 0 to 0.1%, particularly preferably from 0 to less than 0.1%.

When the content of MgO+CaO+SrO+BaO is too large in glass, there is a tendency that the density and the thermal expansion coefficient increase, the glass devitrifies, and the ion exchange performance lowers. Thus, the content of MgO+CaO+SrO+BaO is preferably from 0 to 9.9%, more preferably from 0 to 8%, more preferably from 0 to 6%, particularly preferably from 0 to 5%.

When a molar ratio $(MgO+CaO+SrO+BaO)/(Al_2O_3+B_2O_3)$ increases, the devitrification resistance lowers, the ion exchange performance lowers, and the density and the thermal expansion coefficient increase excessively. Thus, the upper limit range of the molar ratio $(MgO+CaO+SrO+BaO)/(Al_2O_3+B_2O_3)$ is preferably 1 or less, more preferably 0.9 or less, more preferably 0.8 or less, more preferably 0.75 or less, more preferably 0.70 or less, more preferably 0.65 or less, more preferably 0.60 or less, particularly preferably 0.55 or less. However, when the molar ratio $(MgO+CaO+SrO+BaO)/(Al_2O_3+B_2O_3)$ reduces excessively, the viscosity at high temperature increases excessively and the ion exchange performance lowers contrarily. Thus, the lower limit range of the molar ratio $(MgO+CaO+SrO+BaO)/(Al_2O_3+B_2O_3)$ is preferably 0 or more, more preferably 0.05 or more, more preferably 0.10 or more, particularly preferably 0.12 or more.

$TiO_2$ is a component that enhances the ion exchange performance of glass and is a component that reduces the viscosity at high temperature. However, when the content of $TiO_2$ is too large in glass, the glass is liable to be colored and to devitrify. Thus, the content of $TiO_2$ is preferably from 0 to 4.5%, more preferably from 0 to 0.5%, particularly preferably from 0 to 0.3%.

$ZrO_2$ is a component that remarkably enhances the ion exchange performance of glass, and is a component that increases the viscosity of glass around the liquidus viscosity and the strain point. However, when the content of $ZrO_2$ is too large in glass, there is a risk that the devitrification resistance may lower markedly, and there is also a risk that the density may increase excessively. Thus, the content of $ZrO_2$ is preferably from 0 to 5%, more preferably from 0 to 4%, more preferably from 0 to 3%, particularly preferably from 0.001 to 2%.

ZnO is a component that enhances the ion exchange performance of glass and is a component that has a great effect of increasing the compression stress value, in particular. Further, ZnO is a component that reduces the viscosity at high temperature of glass without reducing the viscosity at low temperature. However, when the content of ZnO is too large in glass, there is a tendency that the glass undergoes phase separation, the devitrification resistance lowers, the density increases, and the thickness of the compression stress layer decreases. Thus, the content of ZnO is preferably from 0 to 6%, more preferably from 0 to 5%, more preferably from 0 to 3%, particularly preferably from 0 to 1%.

$P_2O_5$ is a component that enhances the ion exchange performance of glass and is a component that increases the thickness of the compression stress layer, in particular. However, when the content of $P_2O_5$ is too large in glass, the glass undergoes phase separation, and the water resistance is liable to lower. Thus, the content of $P_2O_5$ is preferably from 0 to 10%, more preferably from 0 to 3%, more preferably from 0 to 1%, particularly preferably from 0 to 0.5%.

As a fining agent, one kind or two or more kinds selected from the group consisting of Cl, $SO_3$, and $CeO_2$ (preferably the group consisting of Cl and $SO_3$) may be added at from 0 to 3%.

$SnO_2$ has an effect of enhancing ion exchange performance. Thus, the content of $SnO_2$ is preferably from 0 to 3%, more preferably from 0.01 to 3%, more preferably from 0.05 to 3%, more preferably from 0.1 to 3%, particularly preferably from 0.2 to 3%.

The content of $SnO_2+SO_3+Cl$ is preferably from 0.01 to 3%, more preferably from 0.05 to 3%, more preferably from 0.1 to 3%, particularly preferably from 0.2 to 3% from the viewpoint of simultaneously achieving a fining effect and an effect of enhancing ion exchange performance. It should be noted that the term "$SnO_2+SO_3+Cl$" refers to the total amount of $SnO_2$, Cl, and $SO_3$.

The content of $Fe_2O_3$ is preferably less than 1,000 ppm (less than 0.1%), more preferably less than 800 ppm, more preferably less than 600 ppm, more preferably less than 400 ppm, particularly preferably less than 300 ppm. Further, the molar ratio $Fe_2O_3/(Fe_2O_3+SnO_2)$ is controlled to preferably 0.8 or more, more preferably 0.9 or more, particularly preferably 0.95 or more, while the content of $Fe_2O_3$ is controlled in the above-mentioned range. With this, the transmittance (400 to 770 nm) of glass having a thickness of 1 mm is likely to improve (by, for example, 90% or more).

A rare earth oxide such as $Nd_2O_3$ or $La_2O_3$ is a component that enhances the Young's modulus. However, the cost of the raw material itself is high, and when the rare earth oxide is added in a large amount, the devitrification resistance is liable to deteriorate. Thus, the content of the rare earth oxide is preferably 3% or less, more preferably 2% or less, more preferably 1% or less, more preferably 0.5% or less, particularly preferably 0.1% or less.

The tempered glass of the present invention is substantially free of $As_2O_3$, $Sb_2O_3$, PbO, and F as a glass composition from the standpoint of environmental considerations. In addition, the tempered glass is preferably substantially free of $Bi_2O_3$ from the standpoint of environmental considerations. The gist of the phrase "substantially free of $Bi_2O_3$" resides in that $Bi_2O_3$ is not added positively as a glass component, but contamination with $Bi_2O_3$ as an impurity is allowable. Specifically, the phrase means that the content of $Bi_2O_3$ is less than 0.05%.

When it is desired to achieve both high ion exchange performance and a low crack generation rate, a molar ratio $B_2O_3/Al_2O_3$ is preferably regulated within the range of from 0.0 to 0.2, in particular from 0.0 to 0.1, and a molar ratio $Na_2O/Al_2O_3$ is preferably regulated within the range of from 0.8 to 1.2, in particular, from 0.9 to 1.1. Herein, the "crack generation rate" refers to a value measured as described below. First, in a constant temperature and humidity chamber kept at a humidity of 30% and a temperature of 25° C., a Vickers indenter set to a predetermined load is driven into a glass surface (optically polished surface) for 15 seconds, and 15 seconds after that, the number of cracks generated from the four corners of the indentation is counted (4 per indentation at maximum). The indenter is driven in this manner 20 times, the total number of generated cracks is determined, and then the crack generation rate is determined by the following expression: total number of generated cracks/80×100. In addition, when it is desired to achieve high levels of both the ion exchange performance and the devitrification resistance, 18.5 to 23.5% of $Al_2O_3$, the content of $Na_2O$ is preferably regulated within the range of from 13.8 to 16.3, and more than 16.0 to 25% of $Al_2O_3$, the content of $B_2O_3$ is preferably regulated within the range of from 0.01 to 3.95%. It should be noted that the suitable content range of each component can be appropriately selected to attain a suitable glass composition range. Of those, particularly suitable glass composition ranges are as follows:

(1) comprising as a glass composition, in terms of mass %, 50 to 80% of $SiO_2$, 10 to 30% of $Al_2O_3$, 0 to 6% of $B_2O_3$, 0 to 2% of $Li_2O$, and 5 to 25% of $Na_2O$, and being substantially free of $As_2O_3$, $Sb_2O_3$, PbO, and F;

(2) comprising as a glass composition, in terms of mass %, 50 to 80% of $SiO_2$, 10 to 30% of $Al_2O_3$, 0 to 6% of $B_2O_3$, 0 to 1.7% of $Li_2O$, 5 to 25% of $Na_2O$, and 0 to 2% of SrO, and being substantially free of $As_2O_3$, $Sb_2O_3$, PbO, and F;

(3) comprising as a glass composition, in terms of mass %, 50 to 80% of $SiO_2$, 10 to 30% of $Al_2O_3$, 0 to 6% of $B_2O_3$, 0 to 1.7% of $Li_2O$, 5 to 25% of $Na_2O$, 0 to 2% of SrO, 0 to 9.9% of MgO+CaO+SrO+BaO, and 0 to 0.5% of $TiO_2$, and being substantially free of $As_2O_3$, $Sb_2O_3$, PbO, and F;

(4) comprising as a glass composition, in terms of mass %, 50 to 76% of $SiO_2$, more than 16.0 to 30% of $Al_2O_3$, 0 to 6% of $B_2O_3$, 0 to 1.7% of $Li_2O$, more than 7.0 to 25% of $Na_2O$, 0 to 2% of SrO, 0 to 0.5% of $TiO_2$, and 0 to 4% of $ZrO_2$, and being substantially free of $As_2O_3$, $Sb_2O_3$, PbO, and F;

(5) comprising as a glass composition, in terms of mass %, 50 to 76% of $SiO_2$, more than 16.0 to 30% of $Al_2O_3$, 0 to 6% of $B_2O_3$, 0 to less than 1.0% of $Li_2O$, more than 7.0 to 25% of $Na_2O$, 0 to 2% of SrO, 0 to 9.9% of MgO+CaO+SrO+BaO, 0 to 0.5% of $TiO_2$, 0 to 4% of $ZrO_2$, and 0 to 1% of $P_2O_5$, and being substantially free of $As_2O_3$, $Sb_2O_3$, PbO, and F;

(6) comprising as a glass composition, in terms of mass %, 50 to 76% of $SiO_2$, more than 16.0 to 30% of $Al_2O_3$, 0 to 6% of $B_2O_3$, 0 to 1.0% of $Li_2O$, more than 7.0 to 25% of $Na_2O$, 0 to 2% of SrO, 0 to 9.9% of MgO+CaO+SrO+BaO, 0 to 0.5% of $TiO_2$, 0 to 4% of $ZrO_2$, and to 1% of $P_2O_5$, having a calculated value in terms of mol % $(MgO+CaO+SrO+BaO)/(Al_2O_3+B_2O_3)$ of from 0 to 0.60, and being substantially free of $As_2O_3$, $Sb_2O_3$, PbO, and F;

(7) comprising as a glass composition, in terms of mass %, 50 to 76% of $SiO_2$, more than 16.0 to 30% of $Al_2O_3$, 0 to 6% of $B_2O_3$, 0 to less than 1.0% of $Li_2O$, more than 7.0 to 25% of $Na_2O$, 0 to 2% of SrO, 0 to 9.9% of MgO+CaO+SrO+BaO, 0 to 0.5% of $TiO_2$, 0 to 4% of $ZrO_2$, 0.2 to 3% of $SnO_2$, and 0 to 1% of $P_2O_5$, having a molar ratio $(MgO+CaO+SrO+BaO)/(Al_2O_3+B_2O_3)$ of from 0 to 0.60, and being substantially free of $As_2O_3$, $Sb_2O_3$, PbO, and F; and (8) comprising as a glass composition, in terms of mass %, 50 to 73% of $SiO_2$, more than 16.0 to 30% of $Al_2O_3$, 0 to 6% of $B_2O_3$, 0 to less than 1.0% of $Li_2O$, more than 7.0 to 25% of $Na_2O$, 10 to 30% of $Li_2O+Na_2O+K_2O$, 0 to 2% of SrO, 0 to 9.9% of MgO+CaO+SrO+BaO, 0 to 0.5% of $TiO_2$, 0 to 2% of $ZrO_2$, 0.2 to 3% of $SnO_2$, and 0 to 1% of $P_2O_5$, having a molar ratio $(MgO+CaO+SrO+BaO)/(Al_2O_3+B_2O_3)$ of from 0 to 0.55, and being substantially free of $As_2O_3$, $Sb_2O_3$, PbO, and F.

The tempered glass of the present invention preferably has the following characteristics, for example.

The tempered glass of the present invention has a compression stress layer in a surface thereof. The compression stress value of the compression stress layer is preferably 300 MPa or more, more preferably 400 MPa or more, more preferably 500 MPa or more, more preferably 600 MPa or more, particularly preferably 900 MPa or more. As the compression stress value becomes larger, the mechanical strength of the tempered glass becomes higher. Meanwhile, when an excessively high compression stress is formed in the surface, there is a risk that a tensile stress inside the tempered glass may increase excessively to increase a dimensional change at the time of tempering. Accordingly, the compression stress value of the compression stress layer is preferably 1,200 MPa or less. It should be noted that there is a tendency that the compression stress value is increased by increasing the content of $Al_2O_2$, $TiO_2$, $ZrO_2$, MgO, or ZnO in the glass composition or by decreasing the content of SrO or BaO in the glass composition. Further, there is a tendency that the compression stress value is increased by shortening a time necessary for ion exchange or by decreasing the temperature of an ion exchange solution.

The thickness of the compression stress layer is preferably 10 μm or more, more preferably 15 μm or more, more preferably 20 μm or more, particularly preferably 30 μm or more. As the thickness of the compression stress layer becomes larger, the tempered glass is more hardly cracked even when the tempered glass has a deep flaw, and a variation in the mechanical strength of the tempered glass becomes smaller. Meanwhile, as the thickness of the compression stress layer increases, it becomes more difficult to cut the tempered glass. In addition, there is a risk that a tensile stress inside the tempered glass may increase excessively to increase a dimensional change at the time of tempering. Accordingly, the thickness of the compression stress layer is preferably 60 μm or less. It should be noted that there is a tendency that the thickness of the compression stress layer is increased by increasing the content of $K_2O$ or $P_2O_5$ in the glass composition or by decreasing the content of SrO or BaO in the glass composition. Further, there is a tendency that the thickness of the compression stress layer is increased by lengthening a time necessary for ion exchange or by increasing the temperature of an ion exchange solution.

The tempered glass of the present invention has a density of preferably 2.6 g/cm³ or less, more preferably 2.55 g/cm³ or less, more preferably 2.50 g/cm³ or less, more preferably 2.48 g/cm³ or less, more preferably 2.46 g/cm³ or less, particularly preferably 2.45 g/cm³ or less. As the density becomes smaller, the weight of the tempered glass can be reduced more. It should be noted that the density is easily reduced by increasing the content of $SiO_2$, $B_2O_3$, or $P_2O_5$ in the glass composition or by decreasing the content of an alkali metal oxide, an alkaline earth metal oxide, ZnO, $ZrO_2$, or $TiO_2$ in the glass composition.

The tempered glass of the present invention has a thermal expansion coefficient in a temperature range of from 25 to 380° C. of $100 \times 10^{-7}$/° C. or less, preferably $95 \times 10^{-7}$/° C. or less, more preferably $90 \times 10^{-7}$/° C. or less, particularly preferably $85 \times 10^{-7}$/° C. or less. When the thermal expansion coefficient is regulated within the above-mentioned range, the thermal expansion coefficient can be easily matched with that of a member such as a metal or an organic adhesive, which makes it easy to prevent the detachment of the member such as the metal or the organic adhesive. It should be noted that an increase in the content of an alkali metal oxide or alkaline earth metal oxide in the glass composition is likely to increase the thermal expansion coefficient, and conversely, a reduction in the content of the alkali metal oxide or alkaline earth metal oxide is likely to lower the thermal expansion coefficient.

The tempered glass of the present invention has a temperature at $10^{4.0}$ dPa·s of 1,300° C. or less, preferably 1,280° C. or less, more preferably 1,250° C. or less, more preferably 1,220° C. or less, particularly preferably 1,200° C. or less. As the temperature at $10^{4.0}$ dPa·s becomes lower, a burden on a forming facility is reduced more, the forming facility has a longer life, and consequently, the manufacturing cost of the tempered glass is more likely to be reduced. The temperature at $10^{4.0}$ dPa·s is easily decreased by increasing the content of an alkali metal oxide, an alkaline earth metal oxide, ZnO, $B_2O_3$, or $TiO_2$ or by reducing the content of $SiO_2$ or $Al_2O_3$.

The tempered glass of the present invention has a temperature at $10^{2.5}$ dPa·s of 1,650° C. or less, preferably 1,600° C. or less, more preferably 1,580° C. or less, particularly preferably 1,550° C. or less. As the temperature at $10^{2.5}$ dPa·s becomes lower, melting at lower temperature can be carried out, and hence a burden on glass manufacturing equipment such as a melting furnace is reduced more, and the bubble quality of glass is improved more easily. That is, as the temperature at $10^{2.5}$ dPa·s becomes lower, the manufacturing cost of the tempered glass is more likely to be reduced. Herein, the "temperature at $10^{2.5}$ dPa·s" can be measured by, for example, a platinum sphere pull up method. It should be noted that the temperature at $10^{2.5}$ dPa·s corresponds to a melting temperature. In addition, an increase in the content of an alkali metal oxide, alkaline earth metal oxide, ZnO, $B_2O_3$, or $TiO_2$ in the glass composition or a reduction in the content of $SiO_2$ or $Al_2O_3$ is likely to lower the temperature at $10^{2.5}$ dPa·s.

The tempered glass of the present invention has a liquidus temperature of 1,200° C. or less, preferably 1,150° C. or less, more preferably 1, 100° C. or less, more preferably 1,080° C. or less, more preferably 1, 050° C. or less, more preferably 1,020° C. or less, particularly preferably 1,000° C. or less. It should be noted that as the liquidus temperature becomes lower, the devitrification resistance and formability are improved more. It should be noted that the liquidus temperature is easily decreased by increasing the content of $Na_2O$, $K_2O$, or $B_2O_3$ in the glass composition or by reducing the content of $Al_2O_3$, $Li_2O$, MgO, ZnO, $TiO_2$, or $ZrO_2$.

The tempered glass of the present invention has a liquidus viscosity of preferably $10^{4.0}$ dPa·s or more, more preferably $10^{4.4}$ dPa·s or more, more preferably $10^{4.0}$ dPa·s or more, more preferably $10^{5.0}$ dPa·s or more, more preferably $10^{5.3}$ dPa·s or more, more preferably $10^{5.5}$ dPa·s or more, more preferably $10^{5.7}$ dPa·s or more, more preferably $10^{5.8}$ dPa·s or more, particularly preferably $10^{6.0}$ dPa·s or more. It should be noted that as the liquidus viscosity becomes higher, the devitrification resistance and formability are improved more. Further, the liquidus viscosity is easily increased by increasing the content of $Na_2O$ or $K_2O$ in the glass composition or by reducing the content of $Al_2O_3$, $Li_2O$, MgO, ZnO, $TiO_2$, or $ZrO_2$ in the glass composition.

The tempered glass of the present invention has a Young's modulus of 65 GPa or more, preferably 69 GPa or more, more preferably 71 GPa or more, more preferably 75 GPa or more, particularly preferably 77 GPa or more. As the Young's modulus increases, the tempered glass is less liable to deflect, and in its use in a touch panel display or the like, the amount of deformation of the tempered glass reduces even when the surface of the tempered glass is strongly pressed with a pen or the like. As a result, it becomes easier to prevent a situation in which the tempered glass is brought into contact with a liquid crystal device located behind the tempered glass to cause a display failure. In addition, the amount of deformation with respect to a stress to be generated at the time of tempering treatment reduces, and hence a dimensional change between before and after tempering treatment is reduced.

A tempered glass sheet of the present invention comprises the tempered glass described above. Thus, technical features (suitable characteristics, suitable component ranges, and the like) of the tempered glass sheet of the present invention are the same as the technical features of the tempered glass of the present invention. Accordingly, detailed descriptions of the technical features of the tempered glass sheet of the present invention are omitted here.

The tempered glass sheet of the present invention has a fictive temperature Tf of 500° C. or more, preferably from 520° C. to 700° C., particularly preferably from 550° C. to 750° C. As the fictive temperature Tf increases, the structure of the tempered glass can be more easily relaxed, and hence a dimensional change between before and after tempering treatment reduces. As a result, the dimensional accuracy of the tempered glass sheet can be increased. It should be noted that the fictive temperature Tf can be control led by adjusting forming conditions in an overflow down-draw method.

The surface of the tempered glass sheet of the present invention has an average surface roughness (Ra) of preferably 10 Å or less, more preferably 8 Å or less, more preferably 6 Å or less, more preferably 4 Å or less, more preferably 3 Å or less, particularly preferably 2 Å or less. As the average surface roughness (Ra) increases, the mechanical strength of the tempered glass sheet tends to become lower. Herein, the average surface roughness (Ra) refers to a value measured by a method in conformity with SEMI D7-97 "FPD Glass Substrate Surface Roughness Measurement Method."

The tempered glass sheet of the present invention has a length dimension of 500 mm or more, preferably 700 mm or more, particularly preferably 1,000 mm or more and a width dimension of 500 mm or more, preferably 700 mm or more, particularly preferably 1,000 mm or more. An increase in the size of the tempered glass sheet enables the tempered glass sheet to be suitably used as a cover glass for the display portion of the display of a large-size TV or the like.

The upper limit range of the sheet thickness of the tempered glass sheet of the present invention is 2.0 mm or less, preferably 1.5 mm or less, more preferably 1.3 mm or less, more preferably 1.1 mm or less, more preferably 1.0 mm or less, more preferably 0.8 mm or less, particularly preferably 0.7 mm or less. Meanwhile, when the sheet thickness is excessively small, desired mechanical strength is difficult to obtain. Thus, the sheet thickness is 0.1 mm or more, preferably 0.2 mm or more, more preferably 0.3 mm or more, more preferably 0.4 mm or more, particularly preferably 0.5 mm or more.

A glass to be tempered of the present invention is a glass to be subjected to tempering treatment, comprising as a glass composition, in terms of mass %, 50 to 80% of $SiO_2$, 10 to 30% of $Al_2O_3$, 0 to 6% of $B_2O_3$, 0 to 2% of $Li_2O$, and 5 to 25% of $Na_2O$, and being substantially free of $As_2O_3$, $Sb_2O_3$, PbO, and F. Thus, technical features (suitable characteristics, suitable component ranges, and the like) of the glass to be tempered of the present invention are the same as the technical features of the tempered glass of the present invention or the tempered glass sheet of the present invention. Accordingly, detailed descriptions of the technical features of the glass to be tempered of the present invention are omitted here.

The glass to be tempered of the present invention has a dimensional change rate S between before and after tempering treatment (immersion in a $KNO_3$ molten salt at 440° C. for 6 hours) of from −1,000 ppm to +1,000 ppm, preferably from −500 ppm to +800 ppm, more preferably from −200 ppm to +600 ppm, particularly preferably from −100 ppm to +500 ppm. The dimensional change rate S between before and after tempering treatment can be made close to 0 to the extent possible by increasing the Young's modulus, increasing the fictive temperature Tf, reducing the compression stress value of the compression stress layer, and reducing the thickness of the compression stress layer.

When the glass to be tempered of the present invention is subjected to ion exchange treatment in a $KNO_3$ molten salt at 430° C., it is preferred that the compression stress value of a compression stress layer in a surface thereof be 300 MPa or more and the thickness of the compression stress layer be 10 µm or more, it is more preferred that the compression stress of the surface thereof be 600 MPa or more and the thickness of the compression stress layer be 30 µm or more, and it is particularly preferred that the compression stress of the surface thereof be 700 MPa or more and the thickness of the compression stress layer be 30 µm or more.

When the ion exchange treatment is performed, the temperature of the $KNO_3$ molten salt is preferably from 400 to 550° C., and the ion exchange time is preferably from 1 to 10 hours, particularly preferably from 2 to 8 hours. With this, the compression stress layer can be properly formed easily. It should be noted that the glass to be tempered of the present invention has the above-mentioned glass composition, and hence the compression stress value and thickness of the compression stress layer can be increased without using a mixture of a $KNO_3$ molten salt and a $NaNO_3$ molten salt or the like.

The glass to be tempered of the present invention has a fictive temperature Tf of 500° C. or more, preferably from 520° C. to 700° C., particularly preferably from550° C. to 750° C. As the fictive temperature Tf increases, the structure of the tempered glass can be more easily relaxed, and hence a dimensional change between before and after tempering treatment reduces. As a result, the dimensional accuracy of the tempered glass sheet can be increased. It should be noted that the fictive temperature Tf can be control led by adjusting forming conditions in an overflow down-draw method.

In order to increase the fictive temperature Tf, a cooling rate is preferably increased and a sheet drawing rate is preferably increased. However, when the sheet drawing rate is increased, there is a risk that the glass may reach a cutting step before being sufficiently cooled. In order to prevent such situation, an overflow down-draw method is adopted as a forming method and the glass is cut at a position spaced apart downwardly by 1,000 mm or more, preferably 2,000 mm or more, particularly preferably 3,000 mm or more from the lower end of a forming trough used in the overflow down-draw method.

A crack generation rate before tempering treatment at a load of 1,000 gf is preferably 99% or less, more preferably 90% or less, more preferably 80% or less, more preferably 70% or less, more preferably 60% or less, more preferably 65% or less, particularly preferably 50% or less. As the crack generation rate reduces, a surface flaw is less liable to be created on the tempered glass, and hence the mechanical strength of the tempered glass is less liable to lower. In addition, the mechanical strength is less liable to vary. In addition, when the crack generation rate is low, a lateral crack is hardly generated at the time of post-tempering cutting such as post-tempering scribe cutting, and hence the post-tempering cutting can be easily performed appropriately. As a result, the manufacturing cost of a device can be easily reduced.

It is preferred that the glass to be tempered of the present invention be not devitrified at a contact interface when the glass to be tempered has a viscosity of $10^{4.5}$ dPa·s and is brought into contact for 48 hours with a material for a forming trough (such as dense zircon or alumina, in particular, alumina) to be used in an overflow down-draw method.

The glass to be tempered, tempered glass, and tempered glass sheet of the present invention can be produced as described below.

First, glass raw materials, which have been blended so as to have the above-mentioned glass composition, are loaded in a continuous melting furnace, are melted by heating at from 1,500 to 1,600° C., and are fined. After that, the resultant is fed to a forming apparatus, is formed into a sheet shape or the like, and is annealed. Thus, a glass sheet or the like can be produced.

An overflow down-draw method is preferably adopted as a method of forming the glass sheet. The overflow down-draw method is a method by which a high-quality glass sheet can be produced in a large amount, and by which even a large-size glass sheet can be easily produced. In addition, the fictive temperature Tf of the the glass sheet can be easily increased. Further, in the overflow down-draw method, alumina or dense zircon is used as a forming trough. The glass to be tempered of the present invention has satisfactory compatibility with alumina and dense zircon, in particular, alumina (hardly reacts with the forming trough to generate bubbles, glass stones, or the like).

Various forming methods other than the overflow down-draw method may also be adopted. For example, forming methods such as a float method, a down draw method (such as a slot down method or a re-draw method), a roll out method, and a press method may be adopted.

Next, the resultant glass to be tempered is subjected to tempering treatment, thereby being able to produce a tempered glass. The resultant tempered glass may be cut into pieces having predetermined sizes before the tempering treatment or after the tempering treatment.

The tempering treatment is preferably ion exchange treatment. Conditions for the ion exchange treatment are not particularly limited, and optimum conditions may be selected in view of, for example, the viscosity properties, applications, thickness, inner tensile stress, and dimensional change of glass. The ion exchange treatment can be performed, for example, by immersing glass in a $KNO_3$ molten salt at 400 to 550° C. for 1 to 8 hours. Particularly when the ion exchange of K ions in the $KNO_3$ molten salt with Na components in the glass is performed, it is possible to form efficiently a compression stress layer in a surface of the glass.

EXAMPLE 1

The present invention is hereinafter described based on Examples. It should be noted that Examples are merely illustrative The present invention is by no means limited to Examples.

Tables 1 to 34 show Examples of the present invention (sample Nos. 1 to 204).

TABLE 1

| | | Example | | | | | |
|---|---|---|---|---|---|---|---|
| | | No. 1 | No. 2 | No. 3 | No. 4 | No. 5 | No. 6 |
| Glass composition (mass %) | $SiO_2$ | 60.0 | 59.8 | 59.9 | 59.8 | 59.9 | 59.9 |
| | $Al_2O_3$ | 17.8 | 17.9 | 17.9 | 17.9 | 17.9 | 17.9 |
| | $B_2O_3$ | 0.5 | 0.5 | 0.5 | 0.5 | 0.5 | 0.5 |
| | $Na_2O$ | 12.2 | 13.3 | 14.2 | 15.2 | 12.3 | 13.3 |
| | $K_2O$ | 5.0 | 4.0 | 3.0 | 2.1 | 5.0 | 4.0 |
| | MgO | 1.0 | 1.0 | 1.0 | 1.0 | 2.9 | 2.9 |
| | CaO | 3.0 | 3.0 | 3.0 | 3.0 | 1.0 | 1.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.43 | 0.43 | 0.43 | 0.43 | 0.50 | 0.49 |
| Density (g/cm$^3$) | | 2.47 | 2.48 | 2.48 | 2.48 | 2.46 | 2.46 |
| α (×10$^{-7}$/° C.) | | 95 | 95 | 95 | 94 | 93 | 95 |
| E | | Unmeasured | Unmeasured | Unmeasured | Unmeasured | 72 | 72 |
| Ps (° C.) | | 557 | 555 | 552 | 550 | 571 | 568 |
| Ta (° C.) | | 603 | 600 | 596 | 594 | 620 | 616 |
| Ts (° C.) | | 830 | 823 | 815 | 809 | 861 | 853 |
| $10^4$ dPa · s (° C.) | | 1,218 | 1,209 | 1,197 | 1,185 | 1,250 | 1,237 |
| $10^3$ dPa · s (° C.) | | 1,427 | 1,416 | 1,403 | 1,389 | 1,452 | 1,437 |
| $10^{2.5}$ dPa · s (° C.) | | 1,555 | 1,547 | 1,533 | 1,518 | 1,578 | 1,564 |
| TL (° C.) | | 1,016 | 992 | 977 | 974 | 986 | 1,002 |
| $\log_{10}\eta_{TL}$ (dPa · s) | | 5.4 | 5.6 | 5.6 | 5.6 | 6.1 | 5.8 |
| CS (MPa) | | 823 | 831 | 830 | 831 | 897 | 930 |
| DOL (μm) | | 49 | 46 | 42 | 39 | 57 | 52 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | Unmeasured | Unmeasured | Unmeasured |

TABLE 2

| | | Example | | | | | |
|---|---|---|---|---|---|---|---|
| | | No. 7 | No. 8 | No. 9 | No. 10 | No. 11 | No. 12 |
| Glass composition (mass %) | $SiO_2$ | 59.8 | 59.7 | 57.8 | 57.8 | 57.8 | 57.7 |
| | $Al_2O_3$ | 18.0 | 18.0 | 19.9 | 19.9 | 19.9 | 19.9 |
| | $B_2O_3$ | 0.5 | 0.5 | 0.5 | 0.5 | 0.5 | 0.5 |
| | $Na_2O$ | 14.3 | 15.3 | 12.3 | 13.3 | 14.3 | 15.3 |
| | $K_2O$ | 3.0 | 2.1 | 5.0 | 4.0 | 3.0 | 2.1 |
| | MgO | 2.9 | 2.9 | 1.0 | 1.0 | 1.0 | 1.0 |
| | CaO | 1.0 | 1.0 | 3.0 | 3.0 | 3.0 | 3.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.49 | 0.50 | 0.39 | 0.39 | 0.39 | 0.39 |
| Density (g/cm³) | | 2.47 | 2.47 | 2.48 | 2.48 | 2.48 | 2.49 |
| α (×10⁻⁷/° C.) | | 94 | 94 | 95 | 95 | 95 | 95 |
| E | | 72 | 72 | Unmeasured | Unmeasured | Unmeasured | 73 |
| Ps (° C.) | | 565 | 563 | 573 | 570 | 567 | 566 |
| Ta (° C.) | | 613 | 610 | 621 | 616 | 612 | 611 |
| Ts (° C.) | | 844 | 838 | 853 | 844 | 836 | 831 |
| $10^4$ dPa · s (° C.) | | 1,227 | 1,214 | 1,245 | 1,232 | 1,218 | 1,205 |
| $10^3$ dPa · s (° C.) | | 1,426 | 1,412 | 1,448 | 1,437 | 1,421 | 1,406 |
| $10^{2.5}$ dPa · s (° C.) | | 1,551 | 1,538 | 1,574 | 1,564 | 1,548 | 1,532 |
| TL (° C.) | | 982 | 1,046 | 1,074 | 1,030 | 1,011 | 1,006 |
| $\log_{10}\eta_{TL}$ (dPa · s) | | 5.9 | 5.2 | 5.2 | 5.5 | 5.5 | 5.5 |
| CS (MPa) | | 935 | 937 | 978 | 1,017 | 1,024 | 1,019 |
| DOL (μm) | | 48 | 46 | 50 | 46 | 43 | 40 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | Unmeasured | Unmeasured | Unmeasured |

TABLE 3

| | | Example | | | | | |
|---|---|---|---|---|---|---|---|
| | | No. 13 | No. 14 | No. 15 | No. 16 | No. 17 | No. 18 |
| Glass composition (mass %) | $SiO_2$ | 57.9 | 57.9 | 57.9 | 57.7 | 59.5 | 58.4 |
| | $Al_2O_3$ | 19.9 | 19.9 | 19.9 | 20.0 | 19.3 | 20.4 |
| | $B_2O_3$ | 0.5 | 0.5 | 0.5 | 0.5 | 0.5 | 0.5 |
| | $Na_2O$ | 12.3 | 13.3 | 14.3 | 15.3 | 15.1 | 15.1 |
| | $K_2O$ | 5.0 | 4.0 | 3.0 | 2.1 | 2.1 | 2.1 |
| | MgO | 2.9 | 2.9 | 2.9 | 2.9 | 1.0 | 1.0 |
| | CaO | 1.0 | 1.0 | 1.0 | 1.0 | 2.0 | 2.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.45 | 0.44 | 0.45 | 0.45 | 0.30 | 0.29 |
| Density (g/cm³) | | 2.47 | 2.47 | 2.47 | 2.47 | 2.47 | 2.47 |
| α (×10⁻⁷/° C.) | | 95 | 94 | 94 | 94 | 94 | 93 |
| E | | 73 | Unmeasured | Unmeasured | 72 | 72 | 72 |
| Ps (° C.) | | 590 | 585 | 583 | 579 | 566 | 574 |
| Ta (° C.) | | 640 | 635 | 631 | 627 | 612 | 621 |
| Ts (° C.) | | 884 | 875 | 867 | 861 | 841 | 854 |
| $10^4$ dPa · s (° C.) | | 1,272 | 1,255 | 1,243 | 1,232 | 1,233 | 1,243 |
| $10^3$ dPa · s (° C.) | | 1,468 | 1,450 | 1,437 | 1,426 | 1,441 | 1,450 |
| $10^{2.5}$ dPa · s (° C.) | | 1,588 | 1,570 | 1,558 | 1,546 | 1,571 | 1,578 |
| TL (° C.) | | 1,080 | 1,068 | 1,049 | 1,036 | 974 | 991 |
| $\log_{10}\eta_{TL}$ (dPa · s) | | 5.4 | 5.4 | 5.5 | 5.5 | 5.9 | 5.9 |
| CS (MPa) | | 1,070 | 1,098 | 1,132 | 1,150 | 964 | 1,037 |
| DOL (μm) | | 56 | 53 | 48 | 45 | 44 | 45 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | 54 | Unmeasured | 43 | Unmeasured |
| Compatibility with alumina | | Unmeasured | Unmeasured | Unmeasured | Unmeasured | Unmeasured | Unmeasured |

TABLE 4

| | | Example | | | | | |
|---|---|---|---|---|---|---|---|
| | | No. 19 | No. 20 | No. 21 | No. 22 | No. 23 | No. 24 |
| Glass composition (mass %) | $SiO_2$ | 57.9 | 58.0 | 59.0 | 57.8 | 57.9 | 57.8 |
| | $Al_2O_3$ | 19.9 | 19.8 | 19.9 | 20.9 | 19.9 | 19.9 |
| | $B_2O_3$ | 0.5 | 0.5 | 0.5 | 0.5 | 0.5 | 0.5 |
| | $Na_2O$ | 16.1 | 15.1 | 15.1 | 15.2 | 16.2 | 15.2 |
| | $K_2O$ | 2.1 | 3.1 | 2.1 | 2.1 | 2.1 | 3.1 |
| | MgO | 1.0 | 1.0 | 1.9 | 2.0 | 1.9 | 2.0 |
| | CaO | 2.0 | 2.0 | 1.0 | 1.0 | 1.0 | 1.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.30 | 0.30 | 0.33 | 0.31 | 0.33 | 0.33 |
| Density (g/cm³) | | 2.48 | 2.48 | 2.46 | 2.47 | 2.47 | 2.47 |
| α (×$10^{-7}$/° C.) | | 97 | 97 | 94 | 94 | 97 | 98 |
| E | | 72 | 72 | 72 | 72 | 72 | 72 |
| Ps (° C.) | | 559 | 561 | 578 | 587 | 566 | 568 |
| Ta (° C.) | | 604 | 607 | 627 | 637 | 613 | 616 |
| Ts (° C.) | | 826 | 833 | 865 | 876 | 842 | 852 |
| $10^4$ dPa · s (° C.) | | 1,207 | 1,219 | 1,253 | 1,264 | 1,225 | 1,236 |
| $10^3$ dPa · s (° C.) | | 1,411 | 1,425 | 1,455 | 1,463 | 1,425 | 1,437 |
| $10^{2.5}$ dPa · s (° C.) | | 1,539 | 1,554 | 1,581 | 1,587 | 1,551 | 1,563 |
| TL (° C.) | | 1,008 | 1,022 | 1,037 | 1,099 | 1,026 | 1,053 |
| $\log_{10}\eta_{TL}$ (dPa · s) | | 5.5 | 5.4 | 5.6 | 5.2 | 5.5 | 5.3 |
| CS (MPa) | | 935 | 957 | 1,085 | 1,140 | 1,018 | 1,001 |
| DOL (μm) | | 45 | 48 | 49 | 49 | 49 | 53 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | 61 | Unmeasured | Unmeasured | Unmeasured |
| Compatibility with alumina | | Unmeasured | Unmeasured | Unmeasured | Unmeasured | Unmeasured | Unmeasured |

TABLE 5

| | | Example | | | | | |
|---|---|---|---|---|---|---|---|
| | | No. 25 | No. 26 | No. 27 | No. 28 | No. 29 | No. 30 |
| Glass composition (mass %) | $SiO_2$ | 59.4 | 59.4 | 59.4 | 59.4 | 59.4 | 59.7 |
| | $Al_2O_3$ | 18.7 | 18.7 | 18.7 | 18.7 | 19.7 | 19.5 |
| | $B_2O_3$ | 0.5 | 0.5 | 0.5 | 0.5 | 0.5 | 0.5 |
| | $Na_2O$ | 12.0 | 15.0 | 12.0 | 15.0 | 12.0 | 14.8 |
| | $K_2O$ | 5.0 | 2.0 | 5.0 | 2.0 | 4.0 | 1.1 |
| | MgO | 2.9 | 2.9 | 3.9 | 3.9 | 2.9 | 2.9 |
| | CaO | 1.0 | 1.0 | 0.0 | 0.0 | 1.0 | 1.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.47 | 0.47 | 0.51 | 0.51 | 0.45 | 0.45 |
| Density (g/cm³) | | 2.46 | 2.47 | 2.46 | 2.46 | 2.46 | 2.46 |
| α (×$10^{-7}$/° C.) | | 93 | 93 | 93 | 89 | 89 | 80 |
| E | | 73 | 72 | 72 | 72 | 73 | 72 |
| Ps (° C.) | | 580 | 571 | 595 | 586 | 598 | 590 |
| Ta (° C.) | | 630 | 619 | 648 | 650 | 650 | 640 |
| Ts (° C.) | | 879 | 853 | 896 | 902 | 902 | 880 |
| $10^4$ dPa · s (° C.) | | 1,270 | 1,230 | 1,277 | 1,242 | 1,286 | 1,256 |
| $10^3$ dPa · s (° C.) | | 1,471 | 1,428 | 1,474 | 1,435 | 1,482 | 1,452 |
| $10^{2.5}$ dPa · s (° C.) | | 1,600 | 1,553 | 1,596 | 1,558 | 1,600 | 1,573 |
| TL (° C.) | | 1,052 | 1,004 | Unmeasured | 1,115 | 1,126 | 1,105 |
| $\log_{10}\eta_{TL}$ (dPa · s) | | 5.6 | 5.8 | Unmeasured | 5.0 | 5.1 | 5.1 |
| CS (MPa) | | 948 | 1,005 | 964 | 1,040 | 1,011 | 1,095 |
| DOL (μm) | | 58 | 46 | 62 | 49 | 54 | 42 |
| Fictive temperature (° C.) | | Unmeasured | Unmeasured | Unmeasured | Unmeasured | Unmeasured | Unmeasured |
| Dimensional change rate S (ppm) | | Unmeasured | Unmeasured | Unmeasured | Unmeasured | Unmeasured | Unmeasured |
| Crack generation rate (%) | | 41 | 35 | Unmeasured | Unmeasured | Unmeasured | Unmeasured |
| Compatibility with alumina | | Unmeasured | Unmeasured | Unmeasured | Unmeasured | Unmeasured | Unmeasured |

TABLE 6

| | | Example | | | | | |
|---|---|---|---|---|---|---|---|
| | | No. 31 | No. 32 | No. 33 | No. 34 | No. 35 | No. 36 |
| Glass composition (mass %) | $SiO_2$ | 58.2 | 59.1 | 58.5 | 59.5 | 58.0 | 58.0 |
| | $Al_2O_3$ | 19.3 | 19.3 | 19.5 | 18.5 | 19.0 | 19.0 |
| | $B_2O_3$ | 0.5 | 0.5 | 0.5 | 0.5 | 0.5 | 0.5 |
| | $Na_2O$ | 11.8 | 14.7 | 15.0 | 15.0 | 15.0 | 15.0 |
| | $K_2O$ | 4.9 | 1.1 | 2.0 | 2.0 | 2.0 | 2.0 |
| | MgO | 3.8 | 3.8 | 3.0 | 3.0 | 4.0 | 3.0 |
| | CaO | 1.0 | 1.0 | 1.0 | 1.0 | 1.0 | 1.0 |
| | ZnO | 0.0 | 0.0 | 0.0 | 0.0 | 0.0 | 1.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.57 | 0.57 | 0.46 | 0.49 | 0.60 | 0.48 |
| Density (g/cm$^3$) | | 2.47 | 2.47 | 2.47 | 2.47 | 2.48 | 2.49 |
| $\alpha$ (×10$^{-7}$/° C.) | | 91 | 88 | 94 | 96 | 96 | 95 |
| E | | 73 | 73 | 72 | 72 | 73 | 73 |
| Ps (° C.) | | 593 | 592 | 564 | 568 | 575 | 572 |
| Ta (° C.) | | 643 | 641 | 623 | 616 | 622 | 619 |
| Ts (° C.) | | 886 | 874 | 856 | 847 | 848 | 847 |
| $10^4$ dPa · s (° C.) | | 1,264 | 1,241 | 1,225 | 1,220 | 1,204 | 1,213 |
| $10^3$ dPa · s (° C.) | | 1,456 | 1,432 | 1,420 | 1,418 | 1,392 | 1,405 |
| $10^{2.5}$ dPa · s (° C.) | | 1,575 | 1,551 | 1,542 | 1,540 | 1,513 | 1,527 |
| TL (° C.) | | Unmeasured | 1,156 | 1,053 | 1,004 | 1,068 | 1,071 |
| $\log_{10}\eta_{TL}$ (dPa · s) | | Unmeasured | 4.6 | 5.3 | 5.7 | 5.0 | 5.0 |
| CS (MPa) | | 997 | 1,147 | 1,046 | 989 | 1,074 | 1,062 |
| DOL (μm) | | 53 | 37 | 45 | 45 | 40 | 42 |
| Fictive temperature (° C.) | | Unmeasured | Unmeasured | Unmeasured | Unmeasured | Unmeasured | Unmeasured |
| Dimensional change rate S (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | Unmeasured | Unmeasured | Unmeasured |

TABLE 7

| | | Example | | | | | |
|---|---|---|---|---|---|---|---|
| | | No. 37 | No. 38 | No. 39 | No. 40 | No. 41 | No. 42 |
| Glass composition (mass %) | $SiO_2$ | 64.9 | 57.3 | 60.8 | 60.8 | 61.8 | 61.5 |
| | $Al_2O_3$ | 16.5 | 13.0 | 16.3 | 18.0 | 17.0 | 18.0 |
| | $B_2O_3$ | 0.0 | 2.0 | 0.6 | 0.5 | 0.5 | 0.0 |
| | $Na_2O$ | 14.7 | 14.5 | 14.1 | 15.1 | 15.1 | 15.0 |
| | $K_2O$ | 0.0 | 4.9 | 3.6 | 2.1 | 2.1 | 2.0 |
| | MgO | 3.4 | 2.0 | 3.6 | 3.0 | 3.0 | 3.0 |
| | CaO | 0.1 | 2.0 | 0.5 | 0.0 | 0.0 | 0.0 |
| | $ZrO_2$ | 0.0 | 4.0 | 0.0 | 0.0 | 0.0 | 0.0 |
| | $SnO_2$ | 0.4 | 0.3 | 0.5 | 0.5 | 0.5 | 0.5 |
| Molar ratio (MgO + CaO + SrO + BaO/$Al_2O_3$ + $B_2O_3$) | | 0.53 | 0.55 | 0.58 | 0.40 | 0.42 | 0.42 |
| Density (g/cm$^3$) | | 2.44 | 2.54 | 2.46 | 2.45 | 2.45 | 2.45 |
| $\alpha$ (×10$^{-7}$/° C.) | | 83 | 100 | 92 | 94 | 93 | 93 |
| E | | 70 | Unmeasured | Unmeasured | 71 | 71 | 71 |
| Ps (° C.) | | 597 | 523 | 557 | 573 | 565 | 581 |
| Ta (° C.) | | 648 | 563 | 605 | 622 | 614 | 632 |
| Ts (° C.) | | 893 | 762 | 846 | 862 | 850 | 875 |
| $10^4$ dPa · s (° C.) | | 1,273 | 1,100 | 1,230 | 1,246 | 1,238 | 1,258 |
| $10^3$ dPa · s (° C.) | | 1,476 | 1,280 | 1,430 | 1,449 | 1,441 | 1,460 |
| $10^{2.5}$ dPa · s (° C.) | | 1,610 | 1,396 | 1,560 | 1,577 | 1,570 | 1,591 |
| TL (° C.) | | 1,045 | 855 | 925 | 1,044 | 1,035 | 967 |
| $\log_{10}\eta_{TL}$ (dPa · s) | | 5.8 | 6.1 | 6.6 | 5.5 | 5.5 | 6.4 |
| CS (MPa) | | 991 | 844 | 895 | 910 | 847 | 986 |
| DOL (μm) | | 44 | 44 | 46 | 54 | 54 | 48 |
| Fictive temperature (° C.) | | Unmeasured | Unmeasured | 651 | Unmeasured | Unmeasured | Unmeasured |
| Dimensional change rate S (ppm) | | Unmeasured | Unmeasured | 525 | Unmeasured | Unmeasured | Unmeasured |
| Crack generation rate (%) | | Unmeasured | Unmeasured | Unmeasured | 46 | Unmeasured | Unmeasured |
| Compatibility with alumina | | ○ | Unmeasured | ○ | Unmeasured | Unmeasured | Unmeasured |

TABLE 8

| | | Example | | | | | |
|---|---|---|---|---|---|---|---|
| | | No. 43 | No. 44 | No. 45 | No. 46 | No. 47 | No. 48 |
| Glass composition (mass %) | $SiO_2$ | 62.0 | 61.0 | 61.5 | 61.5 | 62.0 | 62.0 |
| | $Al_2O_3$ | 18.0 | 18.0 | 18.0 | 18.0 | 18.0 | 18.0 |
| | $B_2O_3$ | 0.5 | 0.5 | 0.5 | 0.5 | 0.5 | 0.5 |
| | $Na_2O$ | 15.0 | 16.0 | 14.5 | 15.0 | 14.0 | 14.5 |
| | $K_2O$ | 1.0 | 1.0 | 2.0 | 2.0 | 3.0 | 2.5 |
| | MgO | 3.0 | 3.0 | 3.0 | 2.5 | 2.0 | 2.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.41 | 0.41 | 0.41 | 0.34 | 0.27 | 0.27 |
| Density (g/cm³) | | 2.45 | 2.46 | 2.45 | 2.45 | 2.44 | 2.44 |
| α (×10⁻⁷/° C.) | | 89 | 92 | 92 | 92 | 93 | 92 |
| E | | 71 | 71 | 71 | 71 | 71 | 71 |
| Ps (° C.) | | 583 | 571 | 579 | 569 | 567 | 566 |
| Ta (° C.) | | 634 | 620 | 629 | 618 | 617 | 616 |
| Ts (° C.) | | 877 | 855 | 875 | 862 | 867 | 862 |
| $10^4$ dPa · s (° C.) | | 1,262 | 1,234 | 1,261 | 1,249 | 1,273 | 1,271 |
| $10^3$ dPa · s (° C.) | | 1,464 | 1,435 | 1,463 | 1,455 | 1,486 | 1,483 |
| $10^{2.5}$ dPa · s (° C.) | | 1,589 | 1,561 | 1,589 | 1,582 | 1,616 | 1,614 |
| TL (° C.) | | 1,009 | 1,008 | 1,012 | 984 | 973 | 997 |
| $\log_{10}\eta_{TL}$ (dPa · s) | | 6.0 | 5.7 | 5.9 | 6.1 | 6.3 | 6.0 |
| CS (MPa) | | 986 | 911 | 961 | Unmeasured | Unmeasured | Unmeasured |
| DOL (μm) | | 48 | 49 | 48 | Unmeasured | Unmeasured | Unmeasured |
| Fictive temperature (° C.) | | Unmeasured | Unmeasured | Unmeasured | Unmeasured | Unmeasured | Unmeasured |
| Dimensional change rate S (ppm) | | Unmeasured | Unmeasured | Unmeasured | Unmeasured | Unmeasured | Unmeasured |
| Crack generation rate (%) | | 60 | Unmeasured | 25 | Unmeasured | Unmeasured | Unmeasured |
| Compatibility with alumina | | Unmeasured | Unmeasured | ○ | Unmeasured | Unmeasured | Unmeasured |

TABLE 9

| | | Example | | | | | |
|---|---|---|---|---|---|---|---|
| | | No. 49 | No. 50 | No. 51 | No. 52 | No. 53 | No. 54 |
| Glass composition (mass %) | $SiO_2$ | 63.0 | 61.0 | 61.0 | 61.0 | 59.0 | 62.0 |
| | $Al_2O_3$ | 19.0 | 19.0 | 20.0 | 21.0 | 21.0 | 19.0 |
| | $B_2O_3$ | 1.0 | 1.0 | 1.0 | 1.0 | 1.0 | 1.0 |
| | $Na_2O$ | 14.5 | 14.5 | 14.5 | 14.5 | 14.5 | 15.5 |
| | $K_2O$ | 0.0 | 0.0 | 0.0 | 0.0 | 0.0 | 0.0 |
| | MgO | 2.0 | 4.0 | 3.0 | 2.0 | 4.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.25 | 0.49 | 0.35 | 0.23 | 0.45 | 0.25 |
| Density (g/cm³) | | 2.43 | 2.45 | 2.44 | 2.44 | 2.46 | 2.44 |
| α (×10⁻⁷) | | 82 | 82 | 82 | 82 | 82 | 86 |
| E | | Unmeasured | Unmeasured | Unmeasured | Unmeasured | 73 | 70 |
| Ps (° C.) | | 600 | 602 | 610 | 619 | 616 | 586 |
| Ta (° C.) | | 653 | 653 | 663 | 675 | 667 | 636 |
| Ts (° C.) | | 911.5 | 894 | 913.5 | 938 | 908 | 884.5 |
| $10^4$ dPa · s (° C.) | | 1,312 | 1,259 | 1,297 | 1,335 | 1,276 | 1,286 |
| $10^3$ dPa · s (° C.) | | 1,517 | 1,451 | 1,494 | 1,534 | 1,464 | 1,494 |
| $10^{2.5}$ dPa · s (° C.) | | 1,649 | 1,570 | 1,615 | 1,656 | 1,581 | 1,622 |
| TL (° C.) | | 993 | 1,184 | 1,146 | 1,076 | Unmeasured | 962 |
| $\log_{10}\eta_{TL}$ (dPa · s) | | 6.6 | 4.5 | 5.1 | 6.0 | Unmeasured | 6.6 |
| CS (MPa) | | 1,133 | 1,224 | 1,251 | 1,276 | 1,315 | 1,073 |
| DOL (μm) | | 38 | 30 | 33 | 36 | 28 | 38 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | x | Unmeasured | Unmeasured |

TABLE 10

| | | Example | | | | | |
|---|---|---|---|---|---|---|---|
| | | No. 55 | No. 56 | No. 57 | No. 58 | No. 59 | No. 60 |
| Glass composition (mass %) | $SiO_2$ | 60.0 | 60.0 | 60.0 | 58.0 | 59.0 | 61.0 |
| | $Al_2O_3$ | 19.0 | 20.0 | 21.0 | 21.0 | 19.0 | 19.0 |
| | $B_2O_3$ | 1.0 | 1.0 | 1.0 | 1.0 | 1.0 | 1.0 |
| | $Na_2O$ | 15.5 | 15.5 | 15.5 | 15.5 | 16.5 | 16.5 |
| | $K_2O$ | 0.0 | 0.0 | 0.0 | 0.0 | 0.0 | 0.0 |
| | MgO | 4.0 | 3.0 | 2.0 | 4.0 | 4.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.49 | 0.35 | 0.23 | 0.45 | 0.49 | 0.25 |
| Density (g/cm³) | | 2.46 | 2.45 | 2.44 | 2.46 | 2.46 | 2.45 |
| $\alpha$ (×10⁻⁷) | | 86 | 86 | 86 | 86 | 89 | 88 |
| E | | 71 | 71 | 70 | 72 | 71 | 70 |
| Ps (° C.) | | 592 | 598 | 604 | 606 | 580 | 573 |
| Ta (° C.) | | 641 | 649 | 657 | 656 | 628 | 621 |
| Ts (° C.) | | 875 | 891.5 | 910 | 889 | 853 | 856.5 |
| $10^4$ dPa·s (° C.) | | 1,241 | 1,272 | 1,307 | 1,252 | 1,216 | 1,254 |
| $10^3$ dPa·s (° C.) | | 1,433 | 1,468 | 1,507 | 1,439 | 1,405 | 1,461 |
| $10^{2.5}$ dPa·s (° C.) | | 1,554 | 1,589 | 1,630 | 1,556 | 1,525 | 1,589 |
| TL (° C.) | | 1,139 | 1,091 | 1,029 | 1,189 | 1,075 | 932 |
| $\log_{10}\eta_{TL}$ (dPa·s) | | 4.7 | 5.3 | 6.2 | 4.4 | 5.0 | 6.6 |
| CS (MPa) | | 1,198 | 1,216 | 1,226 | 1,306 | 1,135 | 971 |
| DOL (μm) | | 30 | 33 | 37 | 29 | 30 | 37 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | x | Unmeasured | Unmeasured | Unmeasured |

TABLE 11

| | | Example | | | | | |
|---|---|---|---|---|---|---|---|
| | | No. 61 | No. 62 | No. 63 | No. 64 | No. 65 | No. 66 |
| Glass composition (mass %) | $SiO_2$ | 59.0 | 57.0 | 59.0 | 57.0 | 60.0 | 62.0 |
| | $Al_2O_3$ | 20.0 | 21.0 | 21.0 | 23.0 | 19.0 | 19.0 |
| | $B_2O_3$ | 1.0 | 1.0 | 1.0 | 1.0 | 0.0 | 0.0 |
| | $Na_2O$ | 16.5 | 16.5 | 16.5 | 16.5 | 16.5 | 16.5 |
| | $K_2O$ | 0.0 | 0.0 | 0.0 | 0.0 | 0.0 | 0.0 |
| | MgO | 3.0 | 4.0 | 2.0 | 2.0 | 4.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.35 | 0.45 | 0.23 | 0.21 | 0.53 | 0.27 |
| Density (g/cm³) | | 2.46 | 2.47 | 2.45 | 2.46 | 2.46 | 2.45 |
| $\alpha$ (×10⁻⁷) | | 89 | 87 | 89 | 89 | 89 | 89 |
| E | | 70 | 72 | 70 | Unmeasured | 71 | 70 |
| Ps (° C.) | | 586 | 594 | 590 | 606 | 601 | 591 |
| Ta (° C.) | | 636 | 643 | 640 | 659 | 651 | 642 |
| Ts (° C.) | | 869.5 | 871 | 883.5 | 907 | 880.5 | 883.5 |
| $10^4$ dPa·s (° C.) | | 1,247 | 1,229 | 1,275 | 1,282 | 1,238 | 1,275 |
| $10^3$ dPa·s (° C.) | | 1,442 | 1,414 | 1,475 | 1,473 | 1,430 | 1,481 |
| $10^{2.5}$ dPa·s (° C.) | | 1,563 | 1,530 | 1,597 | 1,591 | 1,550 | 1,608 |
| TL (° C.) | | 1,018 | 1,151 | 1,004 | 1,102 | 1,102 | 970 |
| $\log_{10}\eta_{TL}$ (dPa·s) | | 5.8 | 4.5 | 6.1 | 5.4 | 5.0 | 6.5 |
| CS (MPa) | | 1,153 | 1,277 | 1,152 | 1,304 | 1,190 | 984 |
| DOL (μm) | | 34 | 30 | 38 | 38 | 34 | 42 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | Unmeasured | Unmeasured | Unmeasured |

TABLE 12

| | | Example | | | | | |
|---|---|---|---|---|---|---|---|
| | | No. 67 | No. 68 | No. 69 | No. 70 | No. 71 | No. 72 |
| Glass composition (mass %) | $SiO_2$ | 60.0 | 58.0 | 60.0 | 58.0 | 58.0 | 59.0 |
| | $Al_2O_3$ | 20.0 | 21.0 | 21.0 | 23.0 | 23.0 | 23.0 |
| | $B_2O_3$ | 0.0 | 0.0 | 0.0 | 0.0 | 1.0 | 1.0 |
| | $Na_2O$ | 16.5 | 16.5 | 16.5 | 16.5 | 15.5 | 14.5 |
| | $K_2O$ | 0.0 | 0.0 | 0.0 | 0.0 | 0.0 | 0.0 |
| | MgO | 3.0 | 4.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.38 | 0.48 | 0.24 | 0.22 | 0.21 | 0.21 |
| Density (g/$cm^3$) | | 2.46 | 2.47 | 2.45 | 2.46 | 2.45 | 2.44 |
| $\alpha$ (×$10^{-7}$) | | 90 | 89 | 89 | 90 | 86 | 82 |
| E | | 71 | 72 | 70 | 71 | 71 | 71 |
| Ps (° C.) | | 608 | 617 | 615 | 636 | 618 | 631 |
| Ta (° C.) | | 659 | 667 | 667 | 690 | 673 | 688 |
| Ts (° C.) | | 896.5 | 897.5 | 913.5 | 938.5 | 930.5 | 954 |
| $10^4$ dPa · s (° C.) | | 1,269 | 1,253 | 1,301 | 1,318 | 1,318 | 1,343 |
| $10^3$ dPa · s (° C.) | | 1,465 | 1,440 | 1,501 | 1,510 | 1,511 | 1,533 |
| $10^{2.5}$ dPa · s (° C.) | | 1,586 | 1,557 | 1,624 | 1,630 | 1,633 | 1,653 |
| TL (° C.) | | 1,040 | 1,174 | 1,063 | Unmeasured | 1,081 | 1,165 |
| $\log_{10}\eta_{TL}$ (dPa · s) | | 5.8 | 4.6 | 5.8 | Unmeasured | 5.8 | 5.3 |
| CS (MPa) | | 1,178 | 1,294 | 1,153 | 1,310 | 1,327 | 1,321 |
| DOL (μm) | | 38 | 33 | 43 | 44 | 38 | 39 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | Unmeasured | x | Unmeasured |

TABLE 13

| | | Example | | | | | |
|---|---|---|---|---|---|---|---|
| | | No. 73 | No. 74 | No. 75 | No. 76 | No. 77 | No. 78 |
| Glass composition (mass %) | $SiO_2$ | 61.0 | 61.0 | 61.0 | 61.0 | 61.0 | 59.0 |
| | $Al_2O_3$ | 19.0 | 19.0 | 19.0 | 19.0 | 21.0 | 21.0 |
| | $B_2O_3$ | 2.5 | 2.5 | 2.5 | 2.5 | 0.0 | 3.0 |
| | $Na_2O$ | 13.0 | 12.5 | 14.0 | 13.5 | 15.5 | 15.5 |
| | $K_2O$ | 2.0 | 2.5 | 1.5 | 2.0 | 0.0 | 0.0 |
| | MgO | 2.0 | 2.0 | 1.5 | 1.5 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.22 | 0.22 | 0.17 | 0.17 | 0.24 | 0.20 |
| Density (g/$cm^3$) | | 2.43 | 2.43 | 2.43 | 2.43 | 2.44 | 2.44 |
| $\alpha$ (×$10^{-7}$) | | 86 | 86 | 86 | 87 | 87 | 86 |
| E | | 70 | 70 | 70 | 70 | 70 | 69 |
| Ps (° C.) | | 573 | 572 | 571 | 568 | 626 | 574 |
| Ta (° C.) | | 624 | 623 | 621 | 617 | 681 | 623 |
| Ts (° C.) | | 881.5 | 882 | 870 | 867.5 | 939 | 866 |
| $10^4$ dPa · s (° C.) | | 1,308 | 1,299 | 1,302 | 1,285 | 1,331 | 1,279 |
| $10^3$ dPa · s (° C.) | | 1,516 | 1,508 | 1,516 | 1,500 | 1,529 | 1,479 |
| $10^{2.5}$ dPa · s (° C.) | | 1,643 | 1,635 | 1,646 | 1,631 | 1,652 | 1,603 |
| TL (° C.) | | <990 | <990 | 1,069 | 1,004 | 1,046 | 973 |
| $\log_{10}\eta_{TL}$ (dPa · s) | | >6.4 | >6.4 | 5.5 | 6.0 | 6.3 | 6.3 |
| CS (MPa) | | 992 | 982 | 971 | 956 | 1,185 | 1,133 |
| DOL (μm) | | 40 | 43 | 39 | 40 | 43 | 32 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | x | Unmeasured | ○ | ○ | Unmeasured | Unmeasured |

TABLE 14

| | | Example | | | | | |
|---|---|---|---|---|---|---|---|
| | | No. 79 | No. 80 | No. 81 | No. 82 | No. 83 | No. 84 |
| Glass composition (mass %) | $SiO_2$ | 58.0 | 57.0 | 59.0 | 58.0 | 57.0 | 56.0 |
| | $Al_2O_3$ | 21.0 | 21.0 | 21.0 | 21.0 | 21.0 | 21.0 |
| | $B_2O_3$ | 2.0 | 4.0 | 0.0 | 1.0 | 2.0 | 3.0 |
| | $Na_2O$ | 15.5 | 15.5 | 15.5 | 15.5 | 15.5 | 15.5 |
| | $K_2O$ | 0.0 | 0.0 | 2.0 | 2.0 | 2.0 | 2.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.21 | 0.19 | 0.24 | 0.23 | 0.21 | 0.20 |
| Density (g/cm$^3$) | | 2.44 | 2.44 | 2.46 | 2.46 | 2.45 | 2.45 |
| α (×10$^{-7}$) | | 86 | 86 | 96 | 95 | 95 | 94 |
| E | | Unmeasured | Unmeasured | Unmeasured | Unmeasured | Unmeasured | Unmeasured |
| Ps (° C.) | | 585 | 564 | 599 | 578 | 569 | 554 |
| Ta (° C.) | | 636 | 612 | 651 | 628 | 618 | 600 |
| Ts (° C.) | | 885.5 | 850 | 901.5 | 873.5 | 861 | 830 |
| $10^4$ dPa · s (° C.) | | 1,278 | 1,240 | 1,293 | 1,268 | 1,257 | 1,225 |
| $10^3$ dPa · s (° C.) | | 1,474 | 1,438 | 1,494 | 1,470 | 1,459 | 1,426 |
| $10^{2.5}$ dPa · s (° C.) | | 1,595 | 1,562 | 1,616 | 1,593 | 1,584 | 1,552 |
| TL (° C.) | | 989 | <1,030 | 1,054 | 1,008 | 996 | 977 |
| $\log_{10}\eta_{TL}$ (dPa · s) | | 6.3 | >5.5 | 5.8 | 6.0 | 6.0 | 5.9 |
| CS (MPa) | | 1,140 | 1,095 | 1,078 | 1,061 | 1,054 | 1,030 |
| DOL (μm) | | 36 | 31 | 52 | 47 | 43 | 39 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | Unmeasured | Unmeasured | Unmeasured |

TABLE 15

| | | Example | | | | | |
|---|---|---|---|---|---|---|---|
| | | No. 85 | No. 86 | No. 87 | No. 88 | No. 89 | No. 90 |
| Glass composition (mass %) | $SiO_2$ | 65.1 | 64.0 | 62.9 | 61.8 | 60.7 | 63.5 |
| | $Al_2O_3$ | 19.4 | 19.4 | 19.4 | 19.4 | 19.4 | 21.0 |
| | $B_2O_3$ | 0.0 | 1.1 | 2.2 | 3.3 | 4.4 | 0.0 |
| | $Na_2O$ | 13.6 | 13.6 | 13.6 | 13.6 | 13.6 | 13.6 |
| | $K_2O$ | 0.0 | 0.0 | 0.0 | 0.0 | 0.0 | 0.0 |
| | MgO | 1.4 | 1.4 | 1.4 | 1.4 | 1.4 | 1.4 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.18 | 0.17 | 0.16 | 0.15 | 0.14 | 0.17 |
| Density (g/cm$^3$) | | 2.42 | Unmeasured | 2.41 | Unmeasured | 2.41 | Unmeasured |
| α (×10$^{-7}$) | | 79 | Unmeasured | 79 | Unmeasured | 78 | Unmeasured |
| E | | Unmeasured | Unmeasured | Unmeasured | Unmeasured | Unmeasured | Unmeasured |
| Ps (° C.) | | 641 | Unmeasured | 592 | Unmeasured | 572 | Unmeasured |
| Ta (° C.) | | 700 | Unmeasured | 646 | Unmeasured | 624 | Unmeasured |
| Ts (° C.) | | 979.5 | Unmeasured | 917.5 | Unmeasured | 884.5 | Unmeasured |
| $10^4$ dPa · s (° C.) | | 1,396 | Unmeasured | 1,343 | Unmeasured | 1,300 | Unmeasured |
| $10^3$ dPa · s (° C.) | | 1,601 | Unmeasured | 1,553 | Unmeasured | 1,510 | Unmeasured |
| $10^{2.5}$ dPa · s (° C.) | | 1,724 | Unmeasured | 1,683 | Unmeasured | 1,641 | Unmeasured |
| TL (° C.) | | 1,034 | Unmeasured | <990 | Unmeasured | 1,004 | Unmeasured |
| $\log_{10}\eta_{TL}$ (dPa · s) | | 6.9 | Unmeasured | >6.7 | Unmeasured | 6.2 | Unmeasured |
| CS (MPa) | | 1,095 | Unmeasured | 1,047 | Unmeasured | 1,017 | Unmeasured |
| DOL (μm) | | 46 | Unmeasured | 37 | Unmeasured | 32 | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | ○ | Unmeasured | ○ | Unmeasured | ○ | Unmeasured |

TABLE 16

|  |  | Example | | | | | |
| --- | --- | --- | --- | --- | --- | --- | --- |
|  |  | No. 91 | No. 92 | No. 93 | No. 94 | No. 95 | No. 96 |
| Glass composition (mass %) | $SiO_2$ | 62.5 | 61.5 | 60.5 | 62.4 | 61.4 | 60.4 |
|  | $Al_2O_3$ | 21.0 | 21.0 | 21.0 | 22.3 | 22.3 | 22.3 |
|  | $B_2O_3$ | 1.0 | 2.0 | 3.0 | 0.0 | 1.0 | 2.0 |
|  | $Na_2O$ | 13.6 | 13.6 | 13.6 | 13.5 | 13.5 | 13.5 |
|  | $K_2O$ | 0.0 | 0.0 | 0.0 | 0.0 | 0.0 | 0.0 |
|  | MgO | 1.4 | 1.4 | 1.4 | 1.3 | 1.3 | 1.3 |
|  | CaO | 0.0 | 0.0 | 0.0 | 0.0 | 0.0 | 0.0 |
|  | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.16 | 0.15 | 0.14 | 0.15 | 0.14 | 0.13 |
| Density (g/cm³) | | 2.42 | Unmeasured | Unmeasured | 2.43 | Unmeasured | 2.42 |
| α (×10⁻⁷) | | 79 | Unmeasured | Unmeasured | 79 | Unmeasured | 79 |
| E | | Unmeasured | Unmeasured | Unmeasured | Unmeasured | Unmeasured | Unmeasured |
| Ps (° C.) | | 627 | Unmeasured | Unmeasured | 677 | 643 | 623 |
| Ta (° C.) | | 689 | Unmeasured | Unmeasured | 739 | 704 | 682 |
| Ts (° C.) | | 970 | Unmeasured | Unmeasured | 1,029 | 993 | 966 |
| $10^4$ dPa · s (° C.) | | 1,386 | Unmeasured | Unmeasured | 1,426 | 1,394 | 1,375 |
| $10^3$ dPa · s (° C.) | | 1,586 | Unmeasured | Unmeasured | 1,618 | 1,586 | 1,570 |
| $10^{2.5}$ dPa · s (° C.) | | 1,710 | Unmeasured | Unmeasured | 1,738 | 1,708 | 1,693 |
| TL (° C.) | | 1,133 | Unmeasured | Unmeasured | 1,230 | 1,214 | 1,199 |
| $\log_{10}\eta_{TL}$ (dPa · s) | | 5.8 | Unmeasured | Unmeasured | 5.4 | 5.3 | 5.2 |
| CS (MPa) | | 1,181 | Unmeasured | Unmeasured | 1,231 | 1,170 | 1,220 |
| DOL (μm) | | 42 | Unmeasured | Unmeasured | 48 | 42 | 40 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | 53 | Unmeasured | 44 |
| Compatibility with alumina | | ○ | Unmeasured | Unmeasured | ○ | ○ | ○ |

TABLE 17

|  |  | Example | | | | | |
| --- | --- | --- | --- | --- | --- | --- | --- |
|  |  | No. 97 | No. 98 | No. 99 | No. 100 | No. 101 | No. 102 |
| Glass composition (mass %) | $SiO_2$ | 61.1 | 60.1 | 59.8 | 64.5 | 63.4 | 62.3 |
|  | $Al_2O_3$ | 23.6 | 23.6 | 25.0 | 19.4 | 19.4 | 19.4 |
|  | $B_2O_3$ | 0.0 | 1.0 | 0.0 | 0.0 | 1.1 | 2.2 |
|  | $Na_2O$ | 13.5 | 13.5 | 13.4 | 13.6 | 13.6 | 13.6 |
|  | $K_2O$ | 0.0 | 0.0 | 0.0 | 0.0 | 0.0 | 0.0 |
|  | MgO | 1.3 | 1.3 | 1.3 | 2.0 | 2.0 | 2.0 |
|  | CaO | 0.0 | 0.0 | 0.0 | 0.0 | 0.0 | 0.0 |
|  | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.14 | 0.13 | 0.13 | 0.26 | 0.24 | 0.22 |
| Density (g/cm³) | | Unmeasured | Unmeasured | 2.44 | 2.42 | Unmeasured | 2.42 |
| α (×10⁻⁷) | | Unmeasured | Unmeasured | 76 | 78 | Unmeasured | 78 |
| E | | Unmeasured | Unmeasured | Unmeasured | Unmeasured | Unmeasured | Unmeasured |
| Ps (° C.) | | 688 | 655 | 698 | 640 | Unmeasured | 589 |
| Ta (° C.) | | 750 | 716 | 760 | 698 | Unmeasured | 643 |
| Ts (° C.) | | 1,040 | 1,003 | 1,040 | 971 | Unmeasured | 909 |
| $10^4$ dPa · s (° C.) | | 1,425 | 1,401 | 1,419 | 1,380 | Unmeasured | 1,326 |
| $10^3$ dPa · s (° C.) | | 1,610 | 1,589 | 1,601 | 1,585 | Unmeasured | 1,532 |
| $10^{2.5}$ dPa · s (° C.) | | 1,729 | 1,706 | 1,717 | 1,719 | Unmeasured | 1,660 |
| TL (° C.) | | 1,260 | 1,237 | Unmeasured | 1,091 | Unmeasured | 1,058 |
| $\log_{10}\eta_{TL}$ (dPa · s) | | 5.2 | 5.2 | Unmeasured | 6.2 | Unmeasured | 5.9 |
| CS (MPa) | | 1,182 | 1,194 | 1,263 | 1,140 | Unmeasured | 1,101 |
| DOL (μm) | | 46 | 41 | 42 | 42 | Unmeasured | 33 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | 22 | 48 | Unmeasured | 47 |
| Compatibility with alumina | | ○ | ○ | ○ | x | Unmeasured | ○ |

TABLE 18

| | | Example | | | | | |
|---|---|---|---|---|---|---|---|
| | | No. 103 | No. 104 | No. 105 | No. 106 | No. 107 | No. 108 |
| Glass composition (mass %) | $SiO_2$ | 61.2 | 60.1 | 62.9 | 61.9 | 60.9 | 59.9 |
| | $Al_2O_3$ | 19.4 | 19.4 | 21.0 | 21.0 | 21.0 | 21.0 |
| | $B_2O_3$ | 3.3 | 4.4 | 0.0 | 1.0 | 2.0 | 3.0 |
| | $Na_2O$ | 13.6 | 13.6 | 13.6 | 13.6 | 13.6 | 13.6 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.21 | 0.20 | 0.24 | 0.23 | 0.21 | 0.20 |
| Density (g/cm$^3$) | | Unmeasured | 2.41 | Unmeasured | 2.43 | Unmeasured | Unmeasured |
| $\alpha$ ($\times 10^{-7}$) | | Unmeasured | 79 | Unmeasured | 79 | Unmeasured | Unmeasured |
| E | | Unmeasured | Unmeasured | Unmeasured | Unmeasured | Unmeasured | Unmeasured |
| Ps (° C.) | | Unmeasured | 567 | Unmeasured | 624 | Unmeasured | Unmeasured |
| Ta (° C.) | | Unmeasured | 616 | Unmeasured | 682 | Unmeasured | Unmeasured |
| Ts (° C.) | | Unmeasured | 865 | Unmeasured | 957 | Unmeasured | Unmeasured |
| $10^4$ dPa · s (° C.) | | Unmeasured | 1,284 | Unmeasured | 1,363 | Unmeasured | Unmeasured |
| $10^3$ dPa · s (° C.) | | Unmeasured | 1,489 | Unmeasured | 1,562 | Unmeasured | Unmeasured |
| $10^{2.5}$ dPa · s (° C.) | | Unmeasured | 1,618 | Unmeasured | 1,689 | Unmeasured | Unmeasured |
| TL (° C.) | | Unmeasured | 1,040 | Unmeasured | 1,131 | Unmeasured | Unmeasured |
| $\log_{10}\eta_{TL}$ (dPa · s) | | Unmeasured | 5.7 | Unmeasured | 5.7 | Unmeasured | Unmeasured |
| CS (MPa) | | Unmeasured | 1,038 | Unmeasured | 1,203 | Unmeasured | Unmeasured |
| DOL (μm) | | Unmeasured | 29 | Unmeasured | 37 | Unmeasured | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | 22 | Unmeasured | 43 | Unmeasured | Unmeasured |
| Compatibility with alumina | | Unmeasured | x | Unmeasured | ○ | Unmeasured | Unmeasured |

TABLE 19

| | | Example | | | | | |
|---|---|---|---|---|---|---|---|
| | | No. 109 | No. 110 | No. 111 | No. 112 | No. 113 | No. 114 |
| Glass composition (mass %) | $SiO_2$ | 61.7 | 60.7 | 59.7 | 60.4 | 59.4 | 59.1 |
| | $Al_2O_3$ | 22.3 | 22.3 | 22.3 | 23.6 | 23.6 | 25.0 |
| | $B_2O_3$ | 0.0 | 1.0 | 2.0 | 0.0 | 1.0 | 0.0 |
| | $Na_2O$ | 13.5 | 13.5 | 13.5 | 13.5 | 13.5 | 13.4 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/$Al_2O_3$ + $B_2O_3$) | | 0.23 | 0.21 | 0.20 | 0.21 | 0.20 | 0.20 |
| Density (g/cm$^3$) | | 2.44 | Unmeasured | 2.43 | Unmeasured | Unmeasured | 2.45 |
| $\alpha$ ($\times 10^{-7}$) | | 79 | Unmeasured | 78 | Unmeasured | Unmeasured | 76 |
| E | | Unmeasured | Unmeasured | Unmeasured | Unmeasured | Unmeasured | Unmeasured |
| Ps (° C.) | | 666 | Unmeasured | 619 | Unmeasured | Unmeasured | 682 |
| Ta (° C.) | | 725 | Unmeasured | 676 | Unmeasured | Unmeasured | 742 |
| Ts (° C.) | | 1,003 | Unmeasured | 948 | Unmeasured | Unmeasured | 1,018 |
| $10^4$ dPa · s (° C.) | | 1,394 | Unmeasured | 1,343 | Unmeasured | Unmeasured | 1,387 |
| $10^3$ dPa · s (° C.) | | 1,586 | Unmeasured | 1,535 | Unmeasured | Unmeasured | 1,570 |
| $10^{2.5}$ dPa · s (° C.) | | 1,707 | Unmeasured | 1,655 | Unmeasured | Unmeasured | 1,680 |
| TL (° C.) | | 1,194 | Unmeasured | 1,207 | Unmeasured | Unmeasured | 1,253 |
| $\log_{10}\eta_{TL}$ (dPa · s) | | 5.5 | Unmeasured | 4.9 | Unmeasured | Unmeasured | 5.0 |
| CS (MPa) | | 1,232 | Unmeasured | 1,213 | Unmeasured | Unmeasured | 1,250 |
| DOL (μm) | | 41 | Unmeasured | 34 | Unmeasured | Unmeasured | 37 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | 37 | Unmeasured | 34 | Unmeasured | Unmeasured | 20 |
| Compatibility with alumina | | x | Unmeasured | x | Unmeasured | Unmeasured | Unmeasured |

TABLE 20

| | | Example | | | | | |
|---|---|---|---|---|---|---|---|
| | | No. 115 | No. 116 | No. 117 | No. 118 | No. 119 | No. 120 |
| Glass composition (mass %) | $SiO_2$ | 63.1 | 62.0 | 60.9 | 59.8 | 58.7 | 61.6 |
| | $Al_2O_3$ | 19.4 | 19.4 | 19.4 | 19.4 | 19.4 | 21.0 |
| | $B_2O_3$ | 0.0 | 1.1 | 2.2 | 3.3 | 4.4 | 0.0 |
| | $Na_2O$ | 15.6 | 15.6 | 15.6 | 15.6 | 15.6 | 15.5 |
| | $K_2O$ | 0.0 | 0.0 | 0.0 | 0.0 | 0.0 | 0.0 |
| | MgO | 1.4 | 1.4 | 1.4 | 1.4 | 1.4 | 1.4 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.18 | 0.17 | 0.16 | 0.15 | 0.14 | 0.17 |
| Density (g/cm³) | | 2.44 | Unmeasured | 2.44 | Unmeasured | 2.43 | Unmeasured |
| α (×10⁻⁷) | | 86 | Unmeasured | 86 | Unmeasured | 86 | Unmeasured |
| E | | Unmeasured | Unmeasured | Unmeasured | Unmeasured | Unmeasured | Unmeasured |
| Ps (° C.) | | 601 | Unmeasured | 570 | Unmeasured | 554 | Unmeasured |
| Ta (° C.) | | 654 | Unmeasured | 617 | Unmeasured | 598 | Unmeasured |
| Ts (° C.) | | 912 | Unmeasured | 857 | Unmeasured | 820 | Unmeasured |
| $10^4$ dPa · s (° C.) | | 1,325 | Unmeasured | 1,286 | Unmeasured | 1,234 | Unmeasured |
| $10^3$ dPa · s (° C.) | | 1,538 | Unmeasured | 1,498 | Unmeasured | 1,447 | Unmeasured |
| $10^{2.5}$ dPa · s (° C.) | | 1,669 | Unmeasured | 1,631 | Unmeasured | 1,578 | Unmeasured |
| TL (° C.) | | 1,011 | Unmeasured | 962 | Unmeasured | 888 | Unmeasured |
| $\log_{10}\eta_{TL}$ (dPa · s) | | 6.4 | Unmeasured | 6.4 | Unmeasured | 6.7 | Unmeasured |
| CS (MPa) | | 959 | Unmeasured | 972 | Unmeasured | 968 | Unmeasured |
| DOL (μm) | | 44 | Unmeasured | 35 | Unmeasured | 31 | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | ○ | Unmeasured | ○ | Unmeasured | ○ | Unmeasured |

TABLE 21

| | | Example | | | | | |
|---|---|---|---|---|---|---|---|
| | | No. 121 | No. 122 | No. 123 | No. 124 | No. 125 | No. 126 |
| Glass composition (mass %) | $SiO_2$ | 60.6 | 59.6 | 58.6 | 60.5 | 59.5 | 58.5 |
| | $Al_2O_3$ | 21.0 | 21.0 | 21.0 | 22.3 | 22.3 | 22.3 |
| | $B_2O_3$ | 1.0 | 2.0 | 3.0 | 0.0 | 1.0 | 2.0 |
| | $Na_2O$ | 15.5 | 15.5 | 15.5 | 15.4 | 15.4 | 15.4 |
| | $K_2O$ | 0.0 | 0.0 | 0.0 | 0.0 | 0.0 | 0.0 |
| | MgO | 1.4 | 1.4 | 1.4 | 1.3 | 1.3 | 1.3 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.16 | 0.15 | 0.14 | 0.15 | 0.14 | 0.13 |
| Density (g/cm³) | | 2.44 | Unmeasured | Unmeasured | 2.44 | Unmeasured | 2.44 |
| α (×10⁻⁷) | | 86 | Unmeasured | Unmeasured | 87 | Unmeasured | 86 |
| E | | Unmeasured | Unmeasured | Unmeasured | Unmeasured | Unmeasured | Unmeasured |
| Ps (° C.) | | 597 | Unmeasured | Unmeasured | 646 | 612 | 594 |
| Ta (° C.) | | 650 | Unmeasured | Unmeasured | 703 | 668 | 647 |
| Ts (° C.) | | 910 | Unmeasured | Unmeasured | 969 | 936 | 908 |
| $10^4$ dPa · s (° C.) | | 1,322 | Unmeasured | Unmeasured | 1,369 | 1,336 | 1,316 |
| $10^3$ dPa · s (° C.) | | 1,525 | Unmeasured | Unmeasured | 1,565 | 1,536 | 1,514 |
| $10^{2.5}$ dPa · s (° C.) | | 1,654 | Unmeasured | Unmeasured | 1,687 | 1,658 | 1,636 |
| TL (° C.) | | 1,002 | Unmeasured | Unmeasured | 1,050 | 1,067 | 1,000 |
| $\log_{10}\eta_{TL}$ (dPa · s) | | 6.5 | Unmeasured | Unmeasured | 6.6 | 6.1 | 6.5 |
| CS (MPa) | | 1,121 | Unmeasured | Unmeasured | 1,235 | 1,169 | 1,208 |
| DOL (μm) | | 39 | Unmeasured | Unmeasured | 47 | 40 | 38 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | 41 | Unmeasured | 48 |
| Compatibility with alumina | | ○ | Unmeasured | Unmeasured | ○ | ○ | ○ |

TABLE 22

| | | Example | | | | | |
|---|---|---|---|---|---|---|---|
| | | No. 127 | No. 128 | No. 129 | No. 130 | No. 131 | No. 132 |
| Glass composition (mass %) | $SiO_2$ | 59.3 | 58.3 | 58.0 | 62.5 | 61.4 | 60.3 |
| | $Al_2O_3$ | 23.6 | 23.6 | 25.0 | 19.4 | 19.4 | 19.4 |
| | $B_2O_3$ | 0.0 | 1.0 | 0.0 | 0.0 | 1.1 | 2.2 |
| | $Na_2O$ | 15.3 | 15.3 | 15.2 | 15.6 | 15.6 | 15.6 |
| | $K_2O$ | 0.0 | 0.0 | 0.0 | 0.0 | 0.0 | 0.0 |
| | MgO | 1.3 | 1.3 | 1.3 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.14 | 0.13 | 0.13 | 0.26 | 0.24 | 0.22 |
| Density (g/cm³) | | Unmeasured | Unmeasured | 2.45 | 2.44 | Unmeasured | 2.44 |
| α (×10⁻⁷) | | Unmeasured | Unmeasured | 85 | 87 | Unmeasured | 87 |
| E | | Unmeasured | Unmeasured | Unmeasured | Unmeasured | Unmeasured | Unmeasured |
| Ps (° C.) | | Unmeasured | 629 | 676 | 608 | Unmeasured | 569 |
| Ta (° C.) | | Unmeasured | 686 | 736 | 661 | Unmeasured | 617 |
| Ts (° C.) | | Unmeasured | 957 | 1,010 | 914 | Unmeasured | 856 |
| $10^4$ dPa · s (° C.) | | 1,384 | 1,357 | 1,388 | 1,314 | Unmeasured | 1,261 |
| $10^3$ dPa · s (° C.) | | 1,575 | 1,548 | 1,572 | 1,520 | Unmeasured | 1,468 |
| $10^{2.5}$ dPa · s (° C.) | | 1,694 | 1,668 | 1,685 | 1,649 | Unmeasured | 1,601 |
| TL (° C.) | | 1,138 | 1,144 | 1,193 | 934 | Unmeasured | 929 |
| $\log_{10}\eta_{TL}$ (dPa · s) | | Unmeasured | 5.6 | 5.5 | 7.3 | Unmeasured | 6.7 |
| CS (MPa) | | 1,244 | 1,256 | 1,334 | 1,057 | Unmeasured | 1,035 |
| DOL (μm) | | 47 | 41 | 48 | 42 | Unmeasured | 33 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | 44 | Unmeasured | Unmeasured | 57 |
| Compatibility with alumina | | ○ | Unmeasured | ○ | ○ | Unmeasured | ○ |

TABLE 23

| | | Example | | | | | |
|---|---|---|---|---|---|---|---|
| | | No. 133 | No. 134 | No. 135 | No. 136 | No. 137 | No. 138 |
| Glass composition (mass %) | $SiO_2$ | 59.2 | 58.1 | 61.0 | 60.0 | 59.0 | 58.0 |
| | $Al_2O_3$ | 19.4 | 19.4 | 21.0 | 21.0 | 21.0 | 21.0 |
| | $B_2O_3$ | 3.3 | 4.4 | 0.0 | 1.0 | 3.0 | 2.0 |
| | $Na_2O$ | 15.6 | 15.6 | 15.5 | 15.5 | 15.5 | 15.5 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.21 | 0.20 | 0.24 | 0.23 | 0.20 | 0.21 |
| Density (g/cm³) | | Unmeasured | 2.44 | 2.44 | 2.44 | 2.44 | 2.44 |
| α (×10⁻⁷) | | Unmeasured | 85 | 87 | 86 | 86 | 86 |
| E | | Unmeasured | Unmeasured | 70 | 70 | 69 | Unmeasured |
| Ps (° C.) | | Unmeasured | 553 | 626 | 604 | 574 | 585 |
| Ta (° C.) | | Unmeasured | 597 | 681 | 657 | 623 | 636 |
| Ts (° C.) | | Unmeasured | 818 | 939 | 910 | 866 | 886 |
| $10^4$ dPa · s (° C.) | | Unmeasured | 1,217 | 1,331 | 1,307 | 1,279 | 1,278 |
| $10^3$ dPa · s (° C.) | | Unmeasured | 1,423 | 1,529 | 1,507 | 1,479 | 1,474 |
| $10^{2.5}$ dPa · s (° C.) | | Unmeasured | 1,550 | 1,652 | 1,630 | 1,603 | 1,595 |
| TL (° C.) | | Unmeasured | 921 | 1,046 | 1,029 | 973 | 989 |
| $\log_{10}\eta_{TL}$ (dPa · s) | | Unmeasured | 6.3 | 6.3 | 6.2 | 6.3 | 6.3 |
| CS (MPa) | | Unmeasured | 1,008 | 1,185 | 1,226 | 1,133 | 1,140 |
| DOL (μm) | | Unmeasured | 29 | 43 | 37 | 32 | 36 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | 31 | Unmeasured | Unmeasured | Unmeasured | Unmeasured |
| Compatibility with alumina | | Unmeasured | ○ | Unmeasured | x | Unmeasured | Unmeasured |

TABLE 24

| | | Example | | | | | |
|---|---|---|---|---|---|---|---|
| | | No. 139 | No. 140 | No. 141 | No. 142 | No. 143 | No. 144 |
| Glass composition (mass %) | $SiO_2$ | 59.8 | 58.8 | 57.8 | 58.6 | 57.6 | 57.3 |
| | $Al_2O_3$ | 22.3 | 22.3 | 22.3 | 23.6 | 23.6 | 25.0 |
| | $B_2O_3$ | 0.0 | 1.0 | 2.0 | 0.0 | 1.0 | 0.0 |
| | $Na_2O$ | 15.4 | 15.4 | 15.4 | 15.3 | 15.3 | 15.2 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.23 | 0.21 | 0.20 | 0.21 | 0.20 | 0.20 |
| Density (g/cm$^3$) | | 2.45 | Unmeasured | 2.44 | Unmeasured | Unmeasured | 2.46 |
| α (×10$^{-7}$) | | 86 | Unmeasured | 85 | Unmeasured | Unmeasured | 85 |
| E | | Unmeasured | Unmeasured | Unmeasured | Unmeasured | Unmeasured | Unmeasured |
| Ps (° C.) | | 641 | Unmeasured | 594 | Unmeasured | Unmeasured | 665 |
| Ta (° C.) | | 697 | Unmeasured | 646 | Unmeasured | Unmeasured | 722 |
| Ts (° C.) | | 957 | Unmeasured | 902 | Unmeasured | Unmeasured | 985 |
| $10^4$ dPa · s (° C.) | | 1,348 | Unmeasured | 1,300 | Unmeasured | Unmeasured | 1,359 |
| $10^3$ dPa · s (° C.) | | 1,542 | Unmeasured | 1,494 | Unmeasured | Unmeasured | 1,539 |
| $10^{2.5}$ dPa · s (° C.) | | 1,660 | Unmeasured | 1,612 | Unmeasured | Unmeasured | 1,652 |
| TL (° C.) | | 1,077 | Unmeasured | 1,036 | Unmeasured | Unmeasured | 1,150 |
| $\log_{10}\eta_{TL}$ (dPa · s) | | 6.2 | Unmeasured | 6.0 | Unmeasured | Unmeasured | 5.7 |
| CS (MPa) | | 1,281 | Unmeasured | 1,225 | Unmeasured | Unmeasured | 1,377 |
| DOL (μm) | | 42 | Unmeasured | 35 | Unmeasured | Unmeasured | 40 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | 43 | Unmeasured | Unmeasured | Unmeasured | Unmeasured | Unmeasured |
| Compatibility with alumina | | x | Unmeasured | x | Unmeasured | Unmeasured | x |

TABLE 25

| | | Example | | | | | |
|---|---|---|---|---|---|---|---|
| | | No. 145 | No. 146 | No. 147 | No. 148 | No. 149 | No. 150 |
| Glass composition (mass %) | $SiO_2$ | 64.1 | 63.0 | 61.9 | 60.8 | 59.7 | 62.5 |
| | $Al_2O_3$ | 19.4 | 19.4 | 19.4 | 19.4 | 19.4 | 21.0 |
| | $B_2O_3$ | 0.0 | 1.1 | 2.2 | 3.3 | 4.4 | 0.0 |
| | $Na_2O$ | 14.6 | 14.6 | 14.6 | 14.6 | 14.6 | 14.6 |
| | $K_2O$ | 0.0 | 0.0 | 0.0 | 0.0 | 0.0 | 0.0 |
| | MgO | 1.4 | 1.4 | 1.4 | 1.4 | 1.4 | 1.4 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.18 | 0.17 | 0.16 | 0.15 | 0.14 | 0.17 |
| Density (g/cm$^3$) | | 2.43 | Unmeasured | 2.43 | Unmeasured | 2.42 | Unmeasured |
| α (×10$^{-7}$) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | 618 | Unmeasured | 582 | Unmeasured | 560 | Unmeasured |
| Ta (° C.) | | 674 | Unmeasured | 633 | Unmeasured | 606 | Unmeasured |
| Ts (° C.) | | 942 | Unmeasured | 887 | Unmeasured | 842 | Unmeasured |
| $10^4$ dPa · s (° C.) | | 1,362 | Unmeasured | 1,306 | Unmeasured | 1,264 | Unmeasured |
| $10^3$ dPa · s (° C.) | | 1,572 | Unmeasured | 1,517 | Unmeasured | 1,475 | Unmeasured |
| $10^{2.5}$ dPa · s (° C.) | | 1,705 | Unmeasured | 1,649 | Unmeasured | 1,605 | Unmeasured |
| TL (° C.) | | 954 | Unmeasured | 912 | Unmeasured | 911 | Unmeasured |
| $\log_{10}\eta_{TL}$ (dPa · s) | | 7.4 | Unmeasured | 7.3 | Unmeasured | 6.7 | Unmeasured |
| CS (MPa) | | 1,005 | Unmeasured | 993 | Unmeasured | 981 | Unmeasured |
| DOL (μm) | | 44 | Unmeasured | 36 | Unmeasured | 31 | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | ◯ | Unmeasured | ◯ | Unmeasured | ◯ | Unmeasured |

TABLE 26

| | | Example | | | | | |
|---|---|---|---|---|---|---|---|
| | | No. 151 | No. 152 | No. 153 | No. 154 | No. 155 | No. 156 |
| Glass composition (mass %) | $SiO_2$ | 61.5 | 60.5 | 59.5 | 61.4 | 60.4 | 59.4 |
| | $Al_2O_3$ | 21.0 | 21.0 | 21.0 | 22.3 | 22.3 | 22.3 |
| | $B_2O_3$ | 1.0 | 2.0 | 3.0 | 0.0 | 1.0 | 2.0 |
| | $Na_2O$ | 14.6 | 14.6 | 14.6 | 14.5 | 14.5 | 14.5 |
| | $K_2O$ | 0.0 | 0.0 | 0.0 | 0.0 | 0.0 | 0.0 |
| | MgO | 1.4 | 1.4 | 1.4 | 1.3 | 1.3 | 1.3 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3 + B_2O_3$) | | 0.16 | 0.15 | 0.14 | 0.15 | 0.14 | 0.13 |
| Density (g/cm³) | | 2.43 | Unmeasured | Unmeasured | 2.43 | 2.43 | 2.43 |
| α (×10⁻⁷) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | 612 | Unmeasured | Unmeasured | 658 | 627 | 607 |
| Ta (° C.) | | 669 | Unmeasured | Unmeasured | 718 | 686 | 664 |
| Ts (° C.) | | 939 | Unmeasured | Unmeasured | 996 | 964 | 938 |
| $10^4$ dPa · s (° C.) | | 1,354 | Unmeasured | Unmeasured | 1,395 | 1,371 | 1,347 |
| $10^3$ dPa · s (° C.) | | 1,558 | Unmeasured | Unmeasured | 1,591 | 1,568 | 1,544 |
| $10^{2.5}$ dPa · s (° C.) | | 1,682 | Unmeasured | Unmeasured | 1,709 | 1,690 | 1,669 |
| TL (° C.) | | 982 | Unmeasured | Unmeasured | 1,130 | 1,136 | 1,105 |
| $\log_{10}\eta_{TL}$ (dPa · s) | | 7.1 | Unmeasured | Unmeasured | 6.1 | 5.7 | 5.8 |
| CS (MPa) | | 1,112 | Unmeasured | Unmeasured | 1,191 | 1,206 | 1,182 |
| DOL (μm) | | 40 | Unmeasured | Unmeasured | 47 | 42 | 38 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | 65 | Unmeasured | 50 |
| Compatibility with alumina | | ○ | Unmeasured | Unmeasured | ○ | Unmeasured | ○ |

TABLE 27

| | | Example | | | | | |
|---|---|---|---|---|---|---|---|
| | | No. 157 | No. 158 | No. 159 | No. 160 | No. 161 | No. 162 |
| Glass composition (mass %) | $SiO_2$ | 60.1 | 59.1 | 58.8 | 63.5 | 62.4 | 61.3 |
| | $Al_2O_3$ | 23.6 | 23.6 | 25.0 | 19.4 | 19.4 | 19.4 |
| | $B_2O_3$ | 0.0 | 1.0 | 0.0 | 0.0 | 1.1 | 2.2 |
| | $Na_2O$ | 14.5 | 14.5 | 14.4 | 14.6 | 14.6 | 14.6 |
| | $K_2O$ | 0.0 | 0.0 | 0.0 | 0.0 | 0.0 | 0.0 |
| | MgO | 1.3 | 1.3 | 1.3 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3 + B_2O_3$) | | 0.14 | 0.13 | 0.13 | 0.26 | 0.24 | 0.22 |
| Density (g/cm³) | | 2.44 | Unmeasured | Unmeasured | Unmeasured | Unmeasured | Unmeasured |
| α (×10⁻⁷) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | 673 | 639 | 687 | 623 | Unmeasured | 580 |
| Ta (° C.) | | 733 | 698 | 748 | 679 | Unmeasured | 631 |
| Ts (° C.) | | 1,014 | 979 | 1,027 | 943 | Unmeasured | 883 |
| $10^4$ dPa · s (° C.) | | 1,410 | 1,369 | 1,402 | 1,347 | Unmeasured | 1,291 |
| $10^3$ dPa · s (° C.) | | 1,600 | 1,558 | 1,584 | 1,552 | Unmeasured | 1,496 |
| $10^{2.5}$ dPa · s (° C.) | | 1,716 | 1,680 | 1,698 | 1,680 | Unmeasured | 1,623 |
| TL (° C.) | | 1,197 | 1,199 | 1,228 | 1,014 | Unmeasured | 966 |
| $\log_{10}\eta_{TL}$ (dPa · s) | | 5.6 | 5.2 | 5.3 | 6.7 | Unmeasured | 6.6 |
| CS (MPa) | | 1,233 | 1,256 | 1,277 | 1,076 | Unmeasured | 1,035 |
| DOL (μm) | | 47 | 41 | 45 | 42 | Unmeasured | 34 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | 27 | Unmeasured | Unmeasured | Unmeasured |
| Compatibility with alumina | | Unmeasured | ○ | ○ | x | Unmeasured | x |

TABLE 28

| | | Example | | | | | |
|---|---|---|---|---|---|---|---|
| | | No. 163 | No. 164 | No. 165 | No. 166 | No. 167 | No. 168 |
| Glass composition (mass %) | $SiO_2$ | 60.2 | 59.1 | 61.9 | 60.9 | 59.9 | 58.9 |
| | $Al_2O_3$ | 19.4 | 19.4 | 21.0 | 21.0 | 21.0 | 21.0 |
| | $B_2O_3$ | 3.3 | 4.4 | 0.0 | 1.0 | 2.0 | 3.0 |
| | $Na_2O$ | 14.6 | 14.6 | 14.6 | 14.6 | 14.6 | 14.6 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.21 | 0.20 | 0.24 | 0.23 | 0.21 | 0.20 |
| Density (g/cm$^3$) | | Unmeasured | Unmeasured | Unmeasured | 2.44 | Unmeasured | Unmeasured |
| α (×10$^{-7}$) | | Unmeasured | Unmeasured | Unmeasured | 82 | Unmeasured | Unmeasured |
| E | | Unmeasured | Unmeasured | Unmeasured | 77 | Unmeasured | Unmeasured |
| Ps (° C.) | | Unmeasured | 561 | Unmeasured | 619 | Unmeasured | Unmeasured |
| Ta (° C.) | | Unmeasured | 607 | Unmeasured | 675 | Unmeasured | Unmeasured |
| Ts (° C.) | | Unmeasured | 843 | Unmeasured | 938 | Unmeasured | Unmeasured |
| $10^4$ dPa · s (° C.) | | Unmeasured | 1,250 | Unmeasured | 1,335 | Unmeasured | Unmeasured |
| $10^3$ dPa · s (° C.) | | Unmeasured | 1,455 | Unmeasured | 1,534 | Unmeasured | Unmeasured |
| $10^{2.5}$ dPa · s (° C.) | | Unmeasured | 1,583 | Unmeasured | 1,656 | Unmeasured | Unmeasured |
| TL (° C.) | | Unmeasured | 897 | Unmeasured | 1,076 | Unmeasured | Unmeasured |
| $\log_{10}\eta_{TL}$ (dPa · s) | | Unmeasured | 6.9 | Unmeasured | 6.0 | Unmeasured | Unmeasured |
| CS (MPa) | | Unmeasured | 1,008 | Unmeasured | 1,276 | Unmeasured | Unmeasured |
| DOL (μm) | | Unmeasured | 29 | Unmeasured | 36 | Unmeasured | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | x | Unmeasured | x | Unmeasured | Unmeasured |

TABLE 29

| | | Example | | | | | |
|---|---|---|---|---|---|---|---|
| | | No. 169 | No. 170 | No. 171 | No. 172 | No. 173 | No. 174 |
| Glass composition (mass %) | $SiO_2$ | 60.7 | 59.7 | 58.7 | 59.4 | 58.4 | 58.1 |
| | $Al_2O_3$ | 22.3 | 22.3 | 22.3 | 23.6 | 23.6 | 25.0 |
| | $B_2O_3$ | 0.0 | 1.0 | 2.0 | 0.0 | 1.0 | 0.0 |
| | $Na_2O$ | 14.5 | 14.5 | 14.5 | 14.5 | 14.5 | 14.4 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.23 | 0.21 | 0.20 | 0.21 | 0.20 | 0.20 |
| Density (g/cm$^3$) | | Unmeasured | Unmeasured | Unmeasured | Unmeasured | Unmeasured | Unmeasured |
| α (×10$^{-7}$) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | Unmeasured | Unmeasured | Unmeasured | Unmeasured | Unmeasured | Unmeasured |
| Ta (° C.) | | Unmeasured | Unmeasured | Unmeasured | Unmeasured | Unmeasured | Unmeasured |
| Ts (° C.) | | Unmeasured | Unmeasured | Unmeasured | Unmeasured | Unmeasured | Unmeasured |
| $10^4$ dPa · s (° C.) | | Unmeasured | Unmeasured | Unmeasured | Unmeasured | Unmeasured | Unmeasured |
| $10^3$ dPa · s (° C.) | | Unmeasured | Unmeasured | Unmeasured | Unmeasured | Unmeasured | Unmeasured |
| $10^{2.5}$ dPa · s (° C.) | | Unmeasured | Unmeasured | Unmeasured | Unmeasured | Unmeasured | Unmeasured |
| TL (° C.) | | Unmeasured | Unmeasured | Unmeasured | Unmeasured | Unmeasured | Unmeasured |
| $\log_{10}\eta_{TL}$ (dPa · s) | | Unmeasured | Unmeasured | Unmeasured | Unmeasured | Unmeasured | Unmeasured |
| CS (MPa) | | Unmeasured | Unmeasured | Unmeasured | Unmeasured | Unmeasured | Unmeasured |
| DOL (μm) | | Unmeasured | Unmeasured | Unmeasured | Unmeasured | Unmeasured | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | Unmeasured | Unmeasured | Unmeasured | Unmeasured | Unmeasured |

TABLE 30

| | | Example | | | | | |
|---|---|---|---|---|---|---|---|
| | | No. 175 | No. 176 | No. 177 | No. 178 | No. 179 | No. 180 |
| Glass composition (mass %) | SiO$_2$ | 62.2 | 61.1 | 60.0 | 58.9 | 57.8 | 60.7 |
| | Al$_2$O$_3$ | 19.4 | 19.4 | 19.4 | 19.4 | 19.4 | 21.0 |
| | B$_2$O$_3$ | 0.0 | 1.1 | 2.2 | 3.3 | 4.4 | 0.0 |
| | Na$_2$O | 16.5 | 16.5 | 16.5 | 16.5 | 16.5 | 16.4 |
| | K$_2$O | 0.0 | 0.0 | 0.0 | 0.0 | 0.0 | 0.0 |
| | MgO | 1.4 | 1.4 | 1.4 | 1.4 | 1.4 | 1.4 |
| | CaO | 0.0 | 0.0 | 0.0 | 0.0 | 0.0 | 0.0 |
| | SnO$_2$ | 0.5 | 0.5 | 0.5 | 0.5 | 0.5 | 0.5 |
| Molar ratio (MgO + CaO + SrO + BaO/Al$_2$O$_3$ + B$_2$O$_3$) | | 0.18 | 0.17 | 0.16 | 0.15 | 0.14 | 0.17 |
| Density (g/cm$^3$) | | Unmeasured | Unmeasured | Unmeasured | Unmeasured | Unmeasured | Unmeasured |
| α (×10$^{-7}$) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | 585 | Unmeasured | 559 | Unmeasured | 550 | Unmeasured |
| Ta (° C.) | | 636 | Unmeasured | 604 | Unmeasured | 592 | Unmeasured |
| Ts (° C.) | | 884 | Unmeasured | 834 | Unmeasured | 802 | Unmeasured |
| 10$^4$ dPa · s (° C.) | | 1,289 | Unmeasured | 1,243 | Unmeasured | 1,215 | Unmeasured |
| 10$^3$ dPa · s (° C.) | | 1,500 | Unmeasured | 1,456 | Unmeasured | 1,427 | Unmeasured |
| 10$^{2.5}$ dPa · s (° C.) | | 1,632 | Unmeasured | 1,589 | Unmeasured | 1,558 | Unmeasured |
| TL (° C.) | | 976 | Unmeasured | 946 | Unmeasured | <900 | Unmeasured |
| log$_{10}$η$_{TL}$ (dPa · s) | | 6.5 | Unmeasured | 6.2 | Unmeasured | >6.4 | Unmeasured |
| CS (MPa) | | 867 | Unmeasured | 913 | Unmeasured | 930 | Unmeasured |
| DOL (μm) | | 43 | Unmeasured | 34 | Unmeasured | 30 | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | 68 | Unmeasured | Unmeasured | Unmeasured | Unmeasured | Unmeasured |
| Compatibility with alumina | | ○ | Unmeasured | ○ | Unmeasured | ○ | Unmeasured |

TABLE 31

| | | Example | | | | | |
|---|---|---|---|---|---|---|---|
| | | No. 181 | No. 182 | No. 183 | No. 184 | No. 185 | No. 186 |
| Glass composition (mass %) | SiO$_2$ | 59.7 | 58.7 | 57.7 | 59.6 | 58.6 | 57.6 |
| | Al$_2$O$_3$ | 21.0 | 21.0 | 21.0 | 22.3 | 22.3 | 22.3 |
| | B$_2$O$_3$ | 1.0 | 2.0 | 3.0 | 0.0 | 1.0 | 2.0 |
| | Na$_2$O | 16.4 | 16.4 | 16.4 | 16.3 | 16.3 | 16.3 |
| | K$_2$O | 0.0 | 0.0 | 0.0 | 0.0 | 0.0 | 0.0 |
| | MgO | 1.4 | 1.4 | 1.4 | 1.3 | 1.3 | 1.3 |
| | CaO | 0.0 | 0.0 | 0.0 | 0.0 | 0.0 | 0.0 |
| | SnO$_2$ | 0.5 | 0.5 | 0.5 | 0.5 | 0.5 | 0.5 |
| Molar ratio (MgO + CaO + SrO + BaO/Al$_2$O$_3$ + B$_2$O$_3$) | | 0.16 | 0.15 | 0.14 | 0.15 | 0.14 | 0.13 |
| Density (g/cm$^3$) | | Unmeasured | Unmeasured | Unmeasured | Unmeasured | Unmeasured | Unmeasured |
| α (×10$^{-7}$) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | 583 | Unmeasured | Unmeasured | 627 | 598 | 582 |
| Ta (° C.) | | 633 | Unmeasured | Unmeasured | 681 | 651 | 633 |
| Ts (° C.) | | 881 | Unmeasured | Unmeasured | 940 | 906 | 882 |
| 10$^4$ dPa · s (° C.) | | 1,287 | Unmeasured | Unmeasured | 1,339 | 1,309 | 1,287 |
| 10$^3$ dPa · s (° C.) | | 1,493 | Unmeasured | Unmeasured | 1,538 | 1,508 | 1,487 |
| 10$^{2.5}$ dPa · s (° C.) | | 1,619 | Unmeasured | Unmeasured | 1,664 | 1,635 | 1,611 |
| TL (° C.) | | 956 | Unmeasured | Unmeasured | 1,069 | 1,058 | 1,006 |
| log$_{10}$η$_{TL}$ (dPa · s) | | 6.7 | Unmeasured | Unmeasured | 6.1 | 5.9 | 6.1 |
| CS (MPa) | | 1,009 | Unmeasured | Unmeasured | 1,144 | 1,131 | 1,095 |
| DOL (μm) | | 39 | Unmeasured | Unmeasured | 45 | 40 | 38 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | ○ | Unmeasured | Unmeasured | ○ | ○ | Unmeasured |

TABLE 32

| | | Example | | | | | |
|---|---|---|---|---|---|---|---|
| | | No. 187 | No. 188 | No. 189 | No. 190 | No. 191 | No. 192 |
| Glass composition (mass %) | $SiO_2$ | 58.4 | 57.4 | 57.1 | 61.6 | 60.5 | 59.4 |
| | $Al_2O_3$ | 23.6 | 23.6 | 25.0 | 19.4 | 19.4 | 19.4 |
| | $B_2O_3$ | 0.0 | 1.0 | 0.0 | 0.0 | 1.1 | 2.2 |
| | $Na_2O$ | 16.2 | 16.2 | 16.1 | 16.5 | 16.5 | 16.5 |
| | $K_2O$ | 0.0 | 0.0 | 0.0 | 0.0 | 0.0 | 0.0 |
| | MgO | 1.3 | 1.3 | 1.3 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.14 | 0.13 | 0.13 | 0.26 | 0.24 | 0.22 |
| Density (g/cm$^3$) | | Unmeasured | Unmeasured | Unmeasured | Unmeasured | Unmeasured | Unmeasured |
| $\alpha$ ($\times 10^{-7}$) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | 646 | 614 | 663 | 593 | Unmeasured | 561 |
| Ta (° C.) | | 702 | 669 | 721 | 644 | Unmeasured | 607 |
| Ts (° C.) | | 965 | 931 | 985 | 889 | Unmeasured | 837 |
| $10^4$ dPa · s (° C.) | | 1,353 | 1,325 | 1,368 | 1,286 | Unmeasured | 1,236 |
| $10^3$ dPa · s (° C.) | | 1,544 | 1,518 | 1,553 | 1,491 | Unmeasured | 1,442 |
| $10^{2.5}$ dPa · s (° C.) | | 1,662 | 1,638 | 1,666 | 1,618 | Unmeasured | 1,569 |
| TL (° C.) | | 1,123 | 1,055 | 1,150 | 1,006 | Unmeasured | <900 |
| $\log_{10}\eta_{TL}$ (dPa · s) | | 5.8 | 6.1 | 5.7 | 6.2 | Unmeasured | >6.8 |
| CS (MPa) | | 1,236 | 1,206 | 1,341 | 967 | Unmeasured | 993 |
| DOL (μm) | | 46 | 42 | 46 | 42 | Unmeasured | 31 |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | ○ | Unmeasured | Unmeasured | Unmeasured | ○ |

TABLE 33

| | | Example | | | | | |
|---|---|---|---|---|---|---|---|
| | | No. 193 | No. 194 | No. 195 | No. 196 | No. 197 | No. 198 |
| Glass composition (mass %) | $SiO_2$ | 58.3 | 57.2 | 60.1 | 59.1 | 58.1 | 57.1 |
| | $Al_2O_3$ | 19.4 | 19.4 | 21.0 | 21.0 | 21.0 | 21.0 |
| | $B_2O_3$ | 3.3 | 4.4 | 0.0 | 1.0 | 2.0 | 3.0 |
| | $Na_2O$ | 16.5 | 16.5 | 16.4 | 16.4 | 16.4 | 16.4 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.21 | 0.20 | 0.24 | 0.23 | 0.21 | 0.20 |
| Density (g/cm$^3$) | | Unmeasured | Unmeasured | 2.45 | 2.45 | Unmeasured | Unmeasured |
| $\alpha$ ($\times 10^{-7}$) | | Unmeasured | Unmeasured | 89 | 89 | Unmeasured | Unmeasured |
| E | | Unmeasured | Unmeasured | 70 | 70 | Unmeasured | Unmeasured |
| Ps (° C.) | | Unmeasured | 548 | 615 | 590 | Unmeasured | Unmeasured |
| Ta (° C.) | | Unmeasured | 590 | 667 | 640 | Unmeasured | Unmeasured |
| Ts (° C.) | | Unmeasured | 802 | 914 | 884 | Unmeasured | Unmeasured |
| $10^4$ dPa · s (° C.) | | Unmeasured | 1,195 | 1,301 | 1,275 | Unmeasured | Unmeasured |
| $10^3$ dPa · s (° C.) | | Unmeasured | 1,401 | 1,501 | 1,475 | Unmeasured | Unmeasured |
| $10^{2.5}$ dPa · s (° C.) | | Unmeasured | 1,529 | 1,624 | 1,597 | Unmeasured | Unmeasured |
| TL (° C.) | | Unmeasured | <900 | 1,063 | 1,004 | Unmeasured | Unmeasured |
| $\log_{10}\eta_{TL}$ (dPa · s) | | Unmeasured | >6.3 | 5.8 | 6.1 | Unmeasured | Unmeasured |
| CS (MPa) | | Unmeasured | 982 | 1,153 | 1,152 | Unmeasured | Unmeasured |
| DOL (μm) | | Unmeasured | 27 | 43 | 38 | Unmeasured | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | Unmeasured | ○ | Unmeasured | Unmeasured | Unmeasured | Unmeasured |

TABLE 34

| | | Example | | | | | |
|---|---|---|---|---|---|---|---|
| | | No. 199 | No. 200 | No. 201 | No. 202 | No. 203 | No. 204 |
| Glass composition (mass %) | $SiO_2$ | 58.9 | 57.9 | 56.9 | 57.7 | 56.7 | 56.4 |
| | $Al_2O_3$ | 22.3 | 22.3 | 22.3 | 23.6 | 23.6 | 25.0 |
| | $B_2O_3$ | 0.0 | 1.0 | 2.0 | 0.0 | 1.0 | 0.0 |
| | $Na_2O$ | 16.3 | 16.3 | 16.3 | 16.2 | 16.2 | 16.1 |
| | $K_2O$ | 0.0 | 0.0 | 0.0 | 0.0 | 0.0 | 0.0 |
| | MgO | 2.0 | 2.0 | 2.0 | 2.0 | 2.0 | 2.0 |
| | CaO | 0.0 | 0.0 | 0.0 | 0.0 | 0.0 | 0.0 |
| | $SnO_2$ | 0.5 | 0.5 | 0.5 | 0.5 | 0.5 | 0.5 |
| Molar ratio (MgO + CaO + SrO + BaO/ $Al_2O_3$ + $B_2O_3$) | | 0.23 | 0.21 | 0.20 | 0.21 | 0.20 | 0.20 |
| Density (g/cm$^3$) | | Unmeasured | Unmeasured | Unmeasured | Unmeasured | Unmeasured | Unmeasured |
| $\alpha$ ($\times 10^{-7}$) | | Unmeasured | Unmeasured | Unmeasured | Unmeasured | Unmeasured | Unmeasured |
| E | | Unmeasured | Unmeasured | Unmeasured | Unmeasured | Unmeasured | Unmeasured |
| Ps (° C.) | | 627 | Unmeasured | Unmeasured | Unmeasured | 612 | Unmeasured |
| Ta (° C.) | | 681 | Unmeasured | Unmeasured | Unmeasured | 665 | Unmeasured |
| Ts (° C.) | | 935 | Unmeasured | Unmeasured | Unmeasured | 919 | Unmeasured |
| $10^4$ dPa · s (° C.) | | 1,321 | Unmeasured | 1,263 | Unmeasured | 1,297 | Unmeasured |
| $10^3$ dPa · s (° C.) | | 1,516 | Unmeasured | 1,457 | Unmeasured | 1,484 | Unmeasured |
| $10^{2.5}$ dPa · s (° C.) | | 1,636 | Unmeasured | 1,577 | Unmeasured | 1,597 | Unmeasured |
| TL (° C.) | | 1,085 | Unmeasured | 1,044 | Unmeasured | 1,100 | Unmeasured |
| $\log_{10}\eta_{TL}$ (dPa · s) | | 5.8 | Unmeasured | Unmeasured | Unmeasured | 5.5 | Unmeasured |
| CS (MPa) | | 1,199 | Unmeasured | 1,144 | Unmeasured | 1,269 | Unmeasured |
| DOL (μm) | | 42 | Unmeasured | 34 | Unmeasured | 37 | Unmeasured |
| Fictive temperature (° C.) | | Unmeasured | Unmeasured | Unmeasured | Unmeasured | Unmeasured | Unmeasured |
| Dimensional change rate (ppm) | | Unmeasured | Unmeasured | Unmeasured | Unmeasured | Unmeasured | Unmeasured |
| Crack generation rate (%) | | Unmeasured | Unmeasured | Unmeasured | Unmeasured | Unmeasured | Unmeasured |
| Compatibility with alumina | | ○ | Unmeasured | ○ | Unmeasured | x | Unmeasured |

Each of the samples in the tables was produced as described below. For each of the samples shown in Tables 1 to 8, glass raw materials were blended so as to have the glass composition in the tables, and melted at 1,600° C. for 8 hours using a platinum pot. After that, the resultant molten glass was poured onto a carbon sheet so as to be formed into a sheet shape. In addition, for each of the samples shown in Tables 9 to 34, glass raw materials were blended so as to have the glass composition in the tables, and melted at 1,600° C. for 21 hours using a platinum pot. After that, the resultant molten glass was poured onto a carbon sheet so as to be formed into a sheet shape. The obtained glass sheets were evaluated for various characteristics.

The density ρ is a value obtained through measurement by a known Archimedes method.

The thermal expansion coefficient α is a value obtained through measurement of an average thermal expansion coefficient in a temperature range of from 25 to 380° C. using a dilatometer.

The Young's modulus E is a value obtained through measurement by a well-known resonance method.

The strain point Ps and the annealing point Ta are values obtained through measurement based on a method of ASTM C336.

The softening point Ts is a value obtained through measurement based on a method of ASTM C338.

The temperatures at the viscosities at high temperature of $10^{4.0}$ dPa·s, $10^{3.0}$ dPa·s, and $10^{2.5}$ dPa·s are values obtained through measurement by a platinum sphere pull up method.

The liquidus temperature TL is a value obtained through measurement of a temperature at which crystals of glass are deposited after glass powder that passes through a standard 30-mesh sieve (sieve opening: 500 μm) and remains on a 50-mesh sieve (sieve opening: 300 μm) is placed in a platinum boat and then kept for 24 hours in a gradient heating furnace.

The liquidus viscosity is a value obtained through measurement of a viscosity of glass at the liquidus temperature by a platinum sphere pull up method.

The crack generation rate was measured as described below. First, in a constant temperature and humidity chamber kept at a humidity of 30% and a temperature of 25° C., a Vickers indenter set to a load of 1,000 gf is driven into a glass surface (optically polished surface) for 15 seconds, and 15 seconds after that, the number of cracks generated from the four corners of the indentation is counted (4 per indentation at maximum). The indenter was driven in this manner 20 times, the total number of generated cracks was determined, and then the crack generation rate was determined by the following expression: total number of generated cracks/ 80×100.

The compatibility with alumina was evaluated as described below. Each of the samples having a viscosity of $10^{4.5}$ dPa·s was brought into contact with alumina for 48 hours. After that, a contact interface between each of the samples and alumina was observed, an evaluation was made by marking a case where no devitrified crystal is precipitated with Symbol "○", and marking a case where a devitrified crystal is precipitated with Symbol "x".

As apparent from Tables 1 to 34, each of Samples Nos. 1 to 204 has a density of 2.54 g/cm$^3$ or less and a thermal expansion coefficient of from 88 to 100×10$^{-7}$/° C., thus being suitable as a material for a tempered glass, that is, a glass to be tempered. In addition, each of the samples has a liquidus viscosity of $10^{4.4}$ dPa·s or more, and hence can be formed into a sheet shape by an overflow down-draw method. Moreover, each of the samples has a temperature at $10^{2.5}$ dPa·s of 1,738° C. or less, and hence is considered to allow the production of a glass sheet in a large amount at low cost with high productivity. It should be noted that the glass composition in the surface layer of the glass differs microscopically between before and after tempering treatment, but when the glass is observed as a whole, the glass composition does not differ substantially.

Next, both surfaces of each of the samples shown in Tables 1 to 8 were subjected to optical polishing. After that, each of the samples was subjected to ion exchange treatment by being immersed in a $KNO_3$ molten salt (fresh $KNO_3$ molten salt) at 440° C. for 6 hours. In addition, both surfaces of each of the samples shown in Tables 9 to 34 were subjected to optical polishing. After that, each of the samples was subjected to ion exchange treatment by being immersed in a $KNO_3$ molten salt (fresh $KNO_3$ molten salt) at 430° C. for 4 hours. The surfaces of each of the samples were washed after the ion exchange treatment. Subsequently, the compression stress value (CS) and thickness (DOL) of the compression stress layer in the the surfaces were calculated on the basis of the number of interference fringes observed using a surface stress meter (FSM-6000 manufactured by TOSHIBA CORPORATION) and intervals therebetween. In the calculation, the refractive index and optical elastic constant of each of the samples were defined as 1.51 and 30 [(nm/cm)/MPa], respectively.

As apparent from Tables 1 to 34, when each of the samples was subjected to ion exchange treatment in a fresh $KNO_3$ molten salt, the compression stress layer in a surface thereof had a compression stress value of 823 MPa or more and a thickness of 27 μm or more.

EXAMPLE 2

Glass raw materials were blended so as to have the glass composition of Sample No. 39 shown in Table 7, melted, and fined. After that, the resultant molten glass was formed into a sheet shape by an overflow down-draw method to obtain a glass sheet having a sheet thickness of 0.7 mm. The obtained glass sheet was measured for its fictive temperature Tf. The measurement method for the fictive temperature Tf is described below. A sample is kept at a temperature equal to or higher than its strain point for 24 hours, then rapidly cooled by being immediately brought into contact with a metal sheet, and measured for its dimensional change. When the sample is kept at a temperature T1 higher than the fictive temperature Tf, the dimensional change shows a positive value $\Delta L1$, and when the sample is kept at a temperature T2 lower than the fictive temperature Tf, the dimensional change shows a negative value $\Delta L2$. In the case where T1−T2 is from 0 to 20° C., the Tf can be determined by the following equation: $Tf=(T2\times\Delta L1-T1\times\Delta L2)/(\Delta L1-\Delta L2)$. In addition, the obtained glass sheet was subjected to ion exchange treatment by being immersed in a $KNO_3$ molten salt ($KNO_3$ molten salt having no history of being used) at 440° C. for 6 hours. As a result, as shown in the table, the obtained glass sheet had a fictive temperature Tf of 651° C. and a dimensional change rate S between before and after tempering treatment of 525 ppm. It should be noted that when each of Samples Nos. 1 to 38 and 40 to 204 of Tables 1 to 34 is similarly evaluated, the glass sheet to be obtained is considered to have a fictive temperature Tf of 550° C. or more and a dimensional change rate S between before and after tempering treatment of 1,000 ppm or less.

INDUSTRIAL APPLICABILITY

The tempered glass and tempered glass sheet of the present invention are suitable for a cover glass of a cellular phone, a digital camera, a PDA, or the like, or a glass substrate for a touch panel display or the like. Further, the tempered glass and tempered glass sheet of the present invention can be expected to find use in applications requiring high mechanical strength, for example, a window glass, a substrate for a magnetic disk, a substrate for a flat panel display, a cover glass for a solar battery, a cover glass for a solid image pick-up element, and tableware, in addition to the above-mentioned applications.

The invention claimed is:

1. A method for manufacturing a tempered glass sheet comprising:
   blending glass raw materials so as to obtain a tempered glass sheet comprising as a glass composition, in terms of mass %:
   50 to 80% of $SiO_2$,
   22 to 30% of $Al_2O_3$,
   0 to 6% of $B_2O_3$,
   0 to 2% of $Li_2O$, and
   5 to 25% of $Na_2O$,
   wherein the obtained tempered glass sheet optionally comprises one or more of MgO, CaO, SrO or BaO, and is substantially free of $As_2O_3$, $Sb_2O_3$, PbO, and F;
   heat-melting and fining the glass raw materials in a continuous melting furnace;
   loading the resultant molten glass into a forming trough of alumina;
   forming and annealing the molten glass by an overflow down-draw method so as to attain a fictive temperature Tf of 500° C. or more; and then
   cutting the tempered glass flowing down from the forming trough of alumina.

2. The method for manufacturing a tempered glass sheet according to claim 1,
   wherein the tempered glass sheet is cut at a position spaced apart downwardly by 1,000 mm or more from a lower end of the forming trough of alumina.

3. The method for manufacturing a tempered glass sheet according to claim 1,
   wherein the glass raw materials are blended so as to obtain a tempered glass sheet comprising as a glass composition, in terms of mass %:
   50 to 76% of $SiO_2$,
   22 to 30% of $Al_2O_3$,
   0 to 6% of $B_2O_3$,
   0 to less than 1.0% of $Li_2O$,
   more than 7.0 to 25% of $Na_2O$, and
   0 to 2% of SrO, and
   further comprising 0 to 0.5% of $TiO_2$, 0 to 2% of $ZrO_2$, 0.2 to 3% of $SnO_2$, and 0 to 1% of $P_2O_5$, and having a molar ratio $(MgO+CaO+SrO+BaO)/(Al_2O_3+B_2O_3)$ of from 0 to 0.55.

4. The method for manufacturing a tempered glass sheet according to claim 1,
   wherein the glass raw materials are blended so as to obtain a tempered glass sheet comprising as a glass composition, in terms of mass %:
   50 to 73% of $SiO_2$,
   22 to 30% of $Al_2O_3$,
   0 to 6% of $B_2O_3$,
   0 to less than 1.0% of $Li_2O$,
   more than 7.0 to 25% of $Na_2O$,
   0 to 4% of CaO, and
   0 to 2% of SrO, and
   further comprising 0 to 0.5% of $TiO_2$, 0 to 2% of $ZrO_2$, 0.2 to 3% of $SnO_2$, and 0 to 1% of $P_2O_5$, and optionally comprising $K_2O$ wherein $Li_2O+Na_2O+K_2O$ is 10 to 30 mass %, and having a molar ratio $(MgO+CaO+SrO+BaO)/(Al_2O_3+B_2O_3)$ of from 0 to 0.55.

5. A method for manufacturing a tempered glass sheet comprising:

subjecting, to ion exchange treatment, the tempered glass sheet obtained by the method according to claim 1, so that a compression stress value of the compression stress layer is 300 MPa or more and 1,200 MPa or less, and a thickness of the compression stress layer is 10 μm or more and 60 μm or less; and obtaining the tempered glass sheet.

6. The method for manufacturing a tempered glass sheet according to claim 5, wherein the tempered glass sheet is subjected to ion exchange treatment so as to have a dimensional change rate S before and after the ion exchange treatment from −1,000 ppm to +1,000 ppm.

* * * * *